United States Patent
Scardera et al.

(10) Patent No.: US 9,059,341 B1
(45) Date of Patent: Jun. 16, 2015

(54) METHOD FOR MANUFACTURING AN INTERDIGITATED BACK CONTACT SOLAR CELL

(71) Applicant: E I DU PONT DE NEMOURS AND COMPANY, Wilmington, DE (US)

(72) Inventors: Giuseppe Scardera, Sunnyvale, CA (US); Maxim Kelman, Mountain View, CA (US); Shannon Dugan, Sunnyvale, CA (US); Dmitry Poplavskyy, San Jose, CA (US); Daniel Aneurin Inns, Palo Alto, CA (US); Karim Lotfi Bendimerad, San Francisco, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 1 day.

(21) Appl. No.: 14/161,891

(22) Filed: Jan. 23, 2014

(51) Int. Cl.
  *H01L 21/00* (2006.01)
  *H01L 31/0224* (2006.01)
  *H01L 31/18* (2006.01)

(52) U.S. Cl.
  CPC ........ *H01L 31/022441* (2013.01); *H01L 31/18* (2013.01)

(58) Field of Classification Search
  None
  See application file for complete search history.

(56) References Cited

U.S. PATENT DOCUMENTS

| | | | |
|---|---|---|---|
| 2008/0121621 A1 | 5/2008 | Stockum et al. | |
| 2010/0015756 A1* | 1/2010 | Weidman et al. | 438/96 |
| 2010/0068889 A1 | 3/2010 | Stockum et al. | |
| 2010/0081264 A1 | 4/2010 | Leung et al. | |
| 2010/0136771 A1 | 6/2010 | Kim et al. | |
| 2010/0167510 A1 | 7/2010 | Kelman et al. | |
| 2011/0003424 A1 | 1/2011 | De Ceuster et al. | |
| 2011/0003464 A1 | 1/2011 | Scardera et al. | |
| 2011/0003465 A1 | 1/2011 | Scardera et al. | |
| 2012/0032108 A1 | 2/2012 | Stockum et al. | |
| 2012/0145967 A1 | 6/2012 | Rogojina et al. | |
| 2012/0280183 A1 | 11/2012 | Kelman et al. | |

FOREIGN PATENT DOCUMENTS

JP    2011/124603 A    6/2011

OTHER PUBLICATIONS

Granek, Filip, High-Efficiency Back-Contact Back-Junction Silicon Solar Cells, Dissertation, Fraunhofer Institut fur Solare Energiesysteme (ISE) Freiburg im Breisgau, 2009.
Heath, A Liquid-Solution-Phase of Crystalline Silicon, Science, vol. 258, Nov. 13, 1992, pp. 1131.

(Continued)

*Primary Examiner* — Kyoung Lee

(57) ABSTRACT

A method for manufacturing an interdigitated back contact solar cell. comprising the steps of: (a) providing a silicon substrate doped with a first dopant; (b) doping the rear surface of the silicon substrate with a second dopant in a first pattern; (c) forming a silicon dioxide layer on the rear surface; (d) depositing a silicon-containing paste comprising silicon-containing particles on the silicon dioxide layer in a second pattern; (e) exposing the substrate to a diffusion ambient, wherein the diffusion ambient comprises a third dopant and wherein the third dopant is a counter dopant to the second dopant; (f) heating the substrate in a drive-in ambient; and (g) removing the silicon dioxide layer and the doped silicate glass layer from the silicon substrate, wherein a region doped with the second dopant and a region doped with the third dopant collectively form an interdigitated pattern on the rear surface of the silicon substrate.

15 Claims, 21 Drawing Sheets

(56) References Cited

OTHER PUBLICATIONS

Hubbard, K.J. and Schlom, D. G., Thermodynamic stability of binary oxides in contact with silicon, Journal of Materials Research, vol. 11, Issue 11, 1996, pp. 2757-2776.

Iijima, Fine Particles of Silicon. I. Crystal Growth of Spherical Particles of Si, Japanese Journal of Applied Physics, vol. 26, No. 3, Mar. 1987, pp. 357-364.

Jasinski et al., Photochemical Preparation of Crystalline Silicon Nanoclusters, Chem. Mater. 1991, vol. 3, pp. 989-992.

Lammert, Michael D. and Schwartz, Richard J., The Interdigitated Back Contact Solar Cell: A Silicon Solar Cell for Use in Concentrated Sunlight, IEEE Transactions on Electron Devices, Ed-24, No. 4, Apr. 1977, pp. 337-342.

Littau, et al., A Luminescent Silicon Nanocrystal Colloid via a High-Temperature Aerosol Reaction, J. Phys. Chem. 1993, vol. 97, pp. 1224-1230.

Neuhaus, Dirk-Holger and Munzer, Adolf, Industrial Silicon Wafer Solar Cells, Hindawi Publishing Corporation, Advances in OptoElectronics, vol. 2007, Article ID 24521, 15 Pgs.

Petrovakoch, et al., Rapidthermaloxidized porous Si—The superior photoluminescent Si, Applied Physics Letters, vol. 61, (1992), pp. 943-945.

Takagi, et al., Quantum Size Effects on Photoluminescence in Ultrafine Si Particles, Applied Physics Letters, vol. 56, (1990), pp. 2379-2380.

Verlinden, P.J., Swanson, R.M., Crane, R. A., 7000 High-efficiency Cells for a Dream, Progress in Photovoltaics: Research and Applications, vol. 2, pp. 143-152 (1994).

EL1180USNP (PCT/US2015/012202) International Search Report and Written Opinion Dated Apr. 10, 2015.

\* cited by examiner

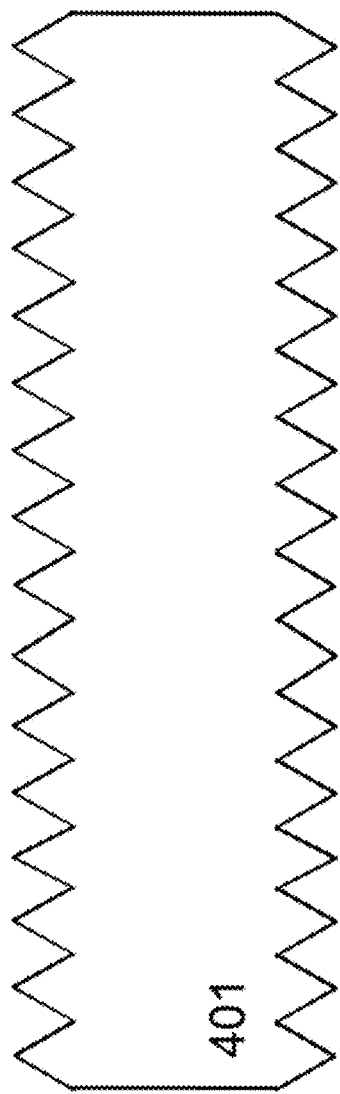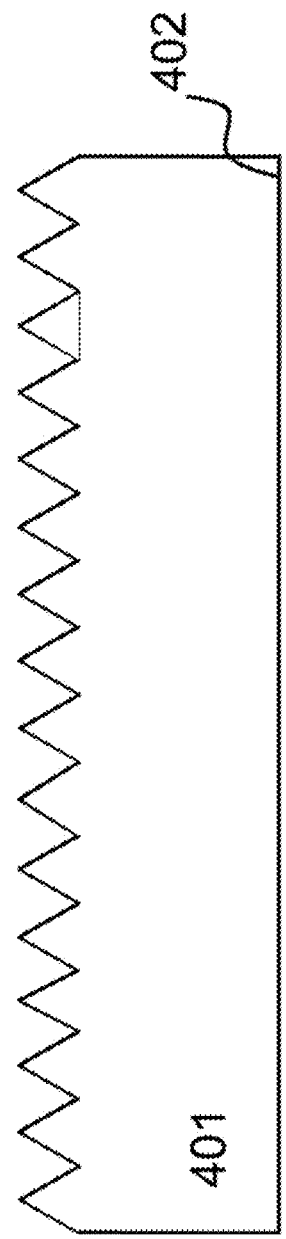
Fig. 4A
Fig. 4B

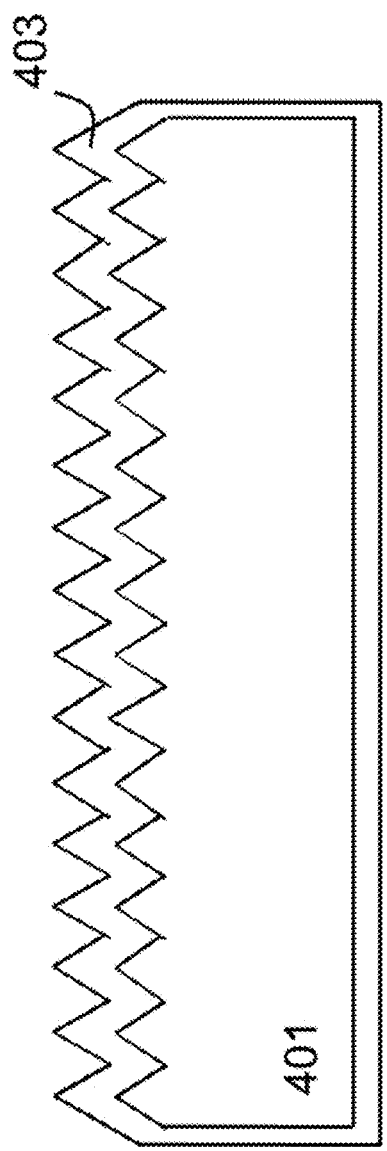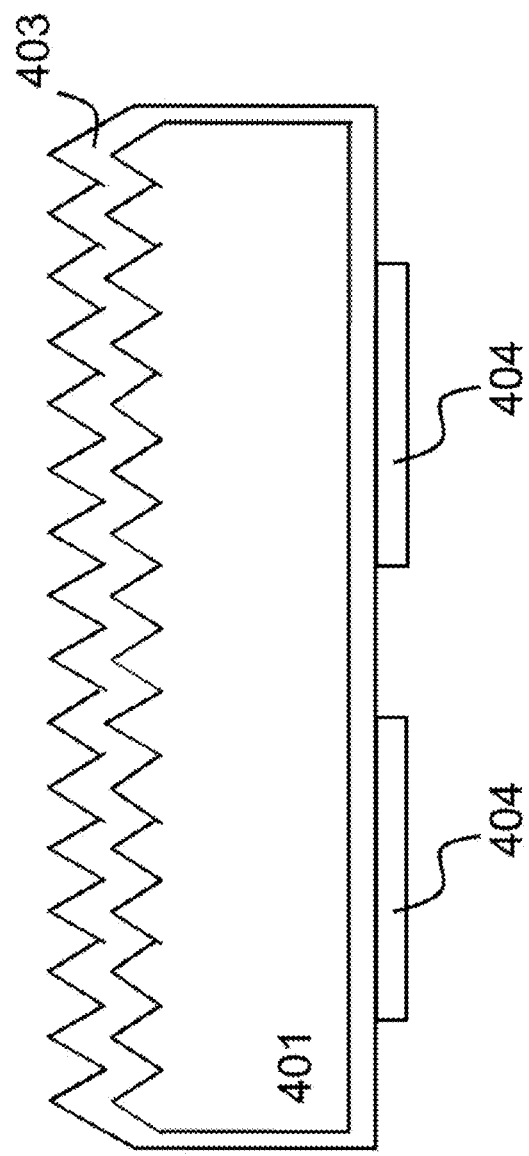

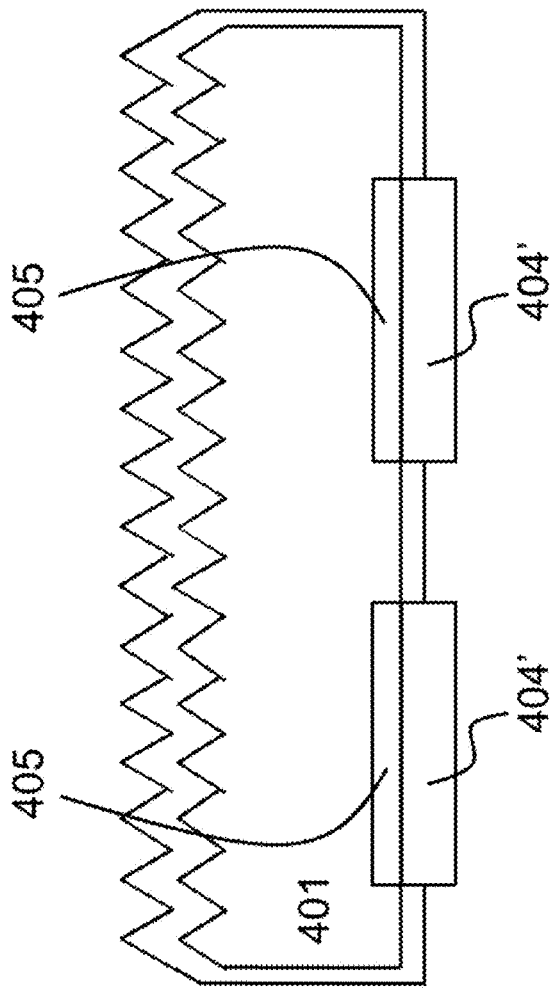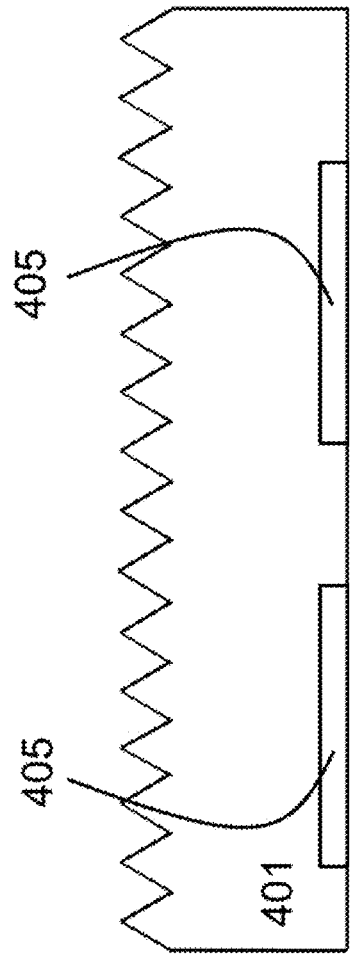
Fig. 4E
Fig. 4F

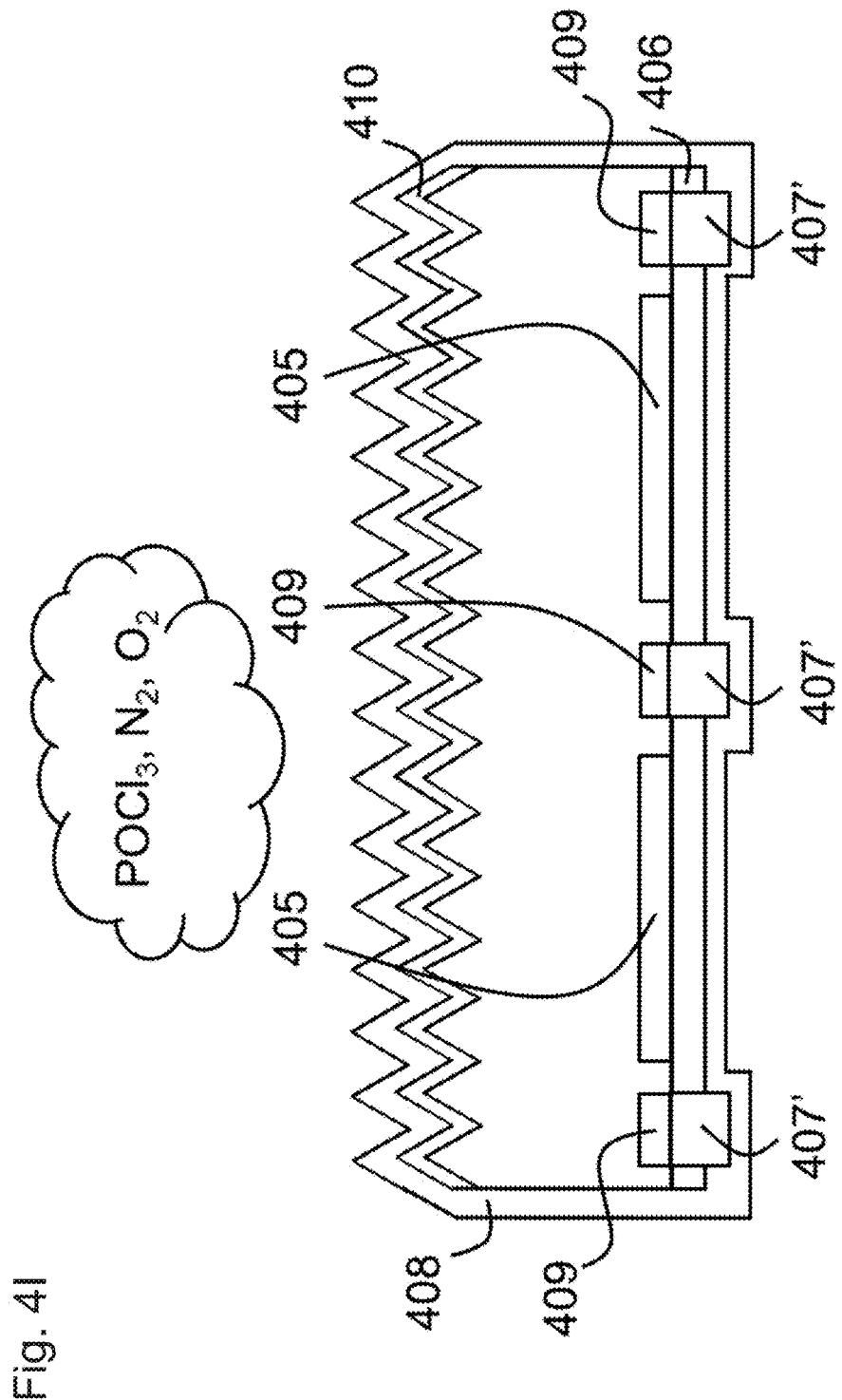

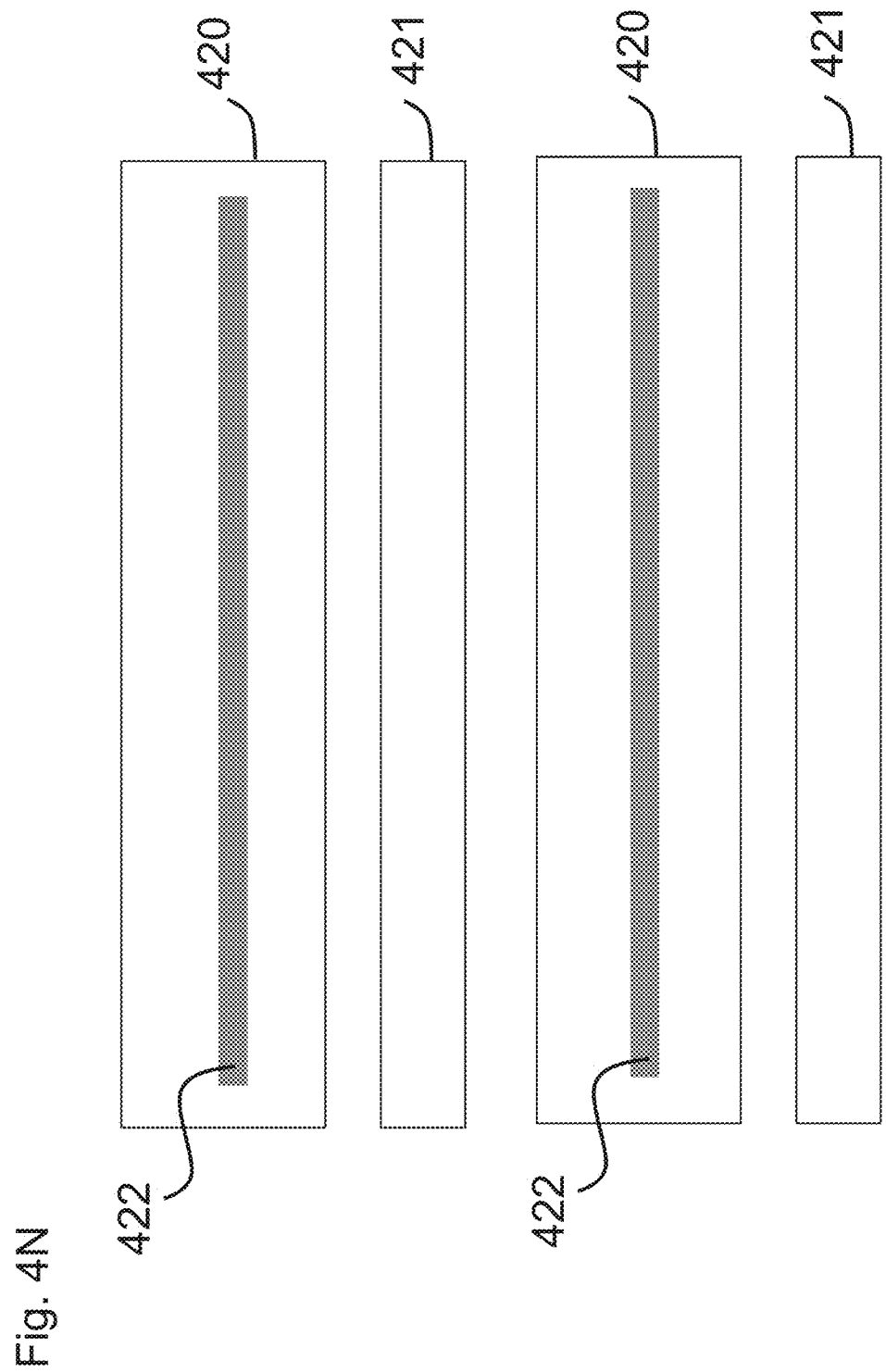

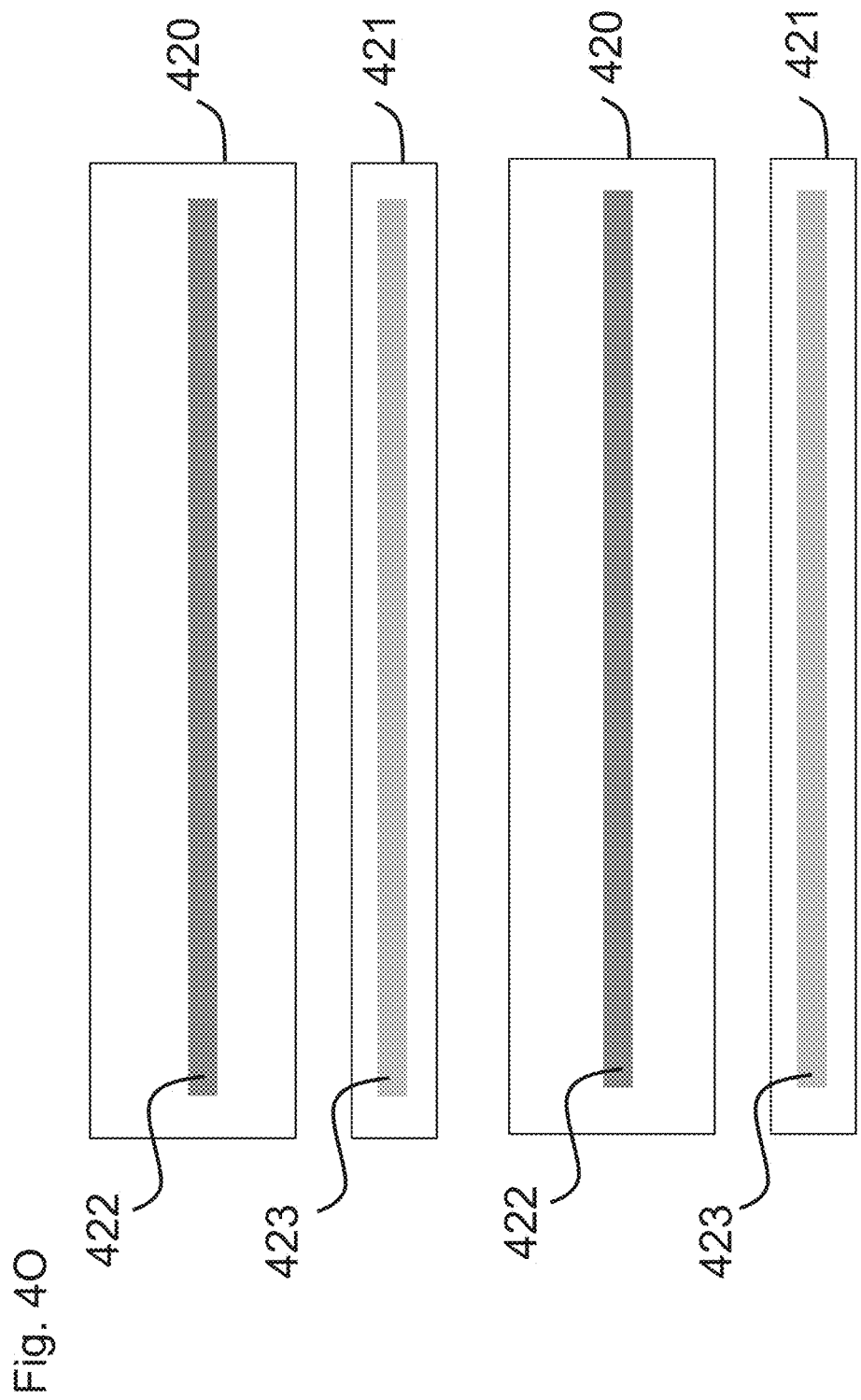

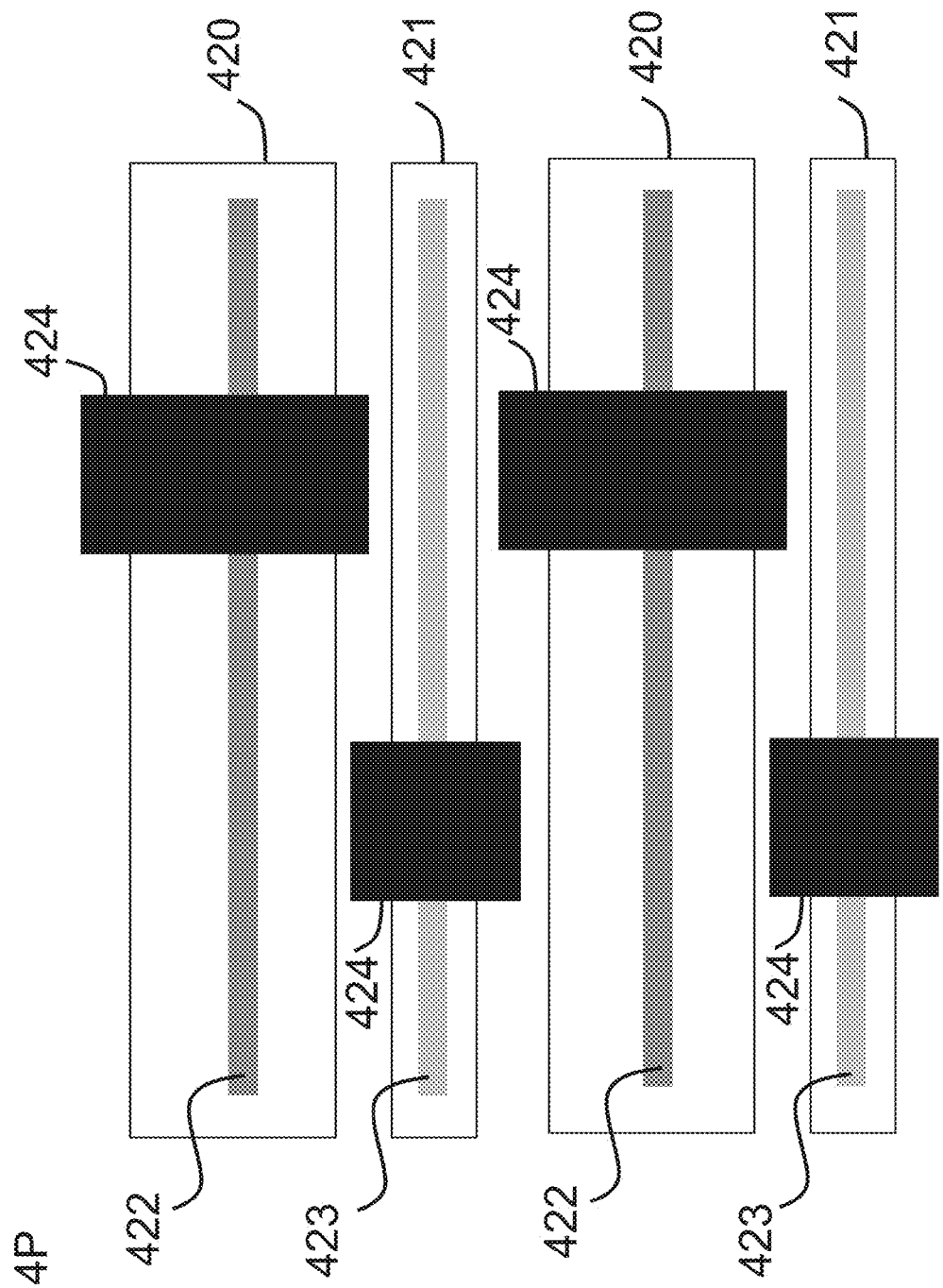

METHOD FOR MANUFACTURING AN INTERDIGITATED BACK CONTACT SOLAR CELL

FIELD OF THE INVENTION

This disclosure relates to an interdigitated back contact solar cell where localized boron diffused area and phosphorus diffused areas are formed on the rear side.

TECHNICAL BACKGROUND OF THE INVENTION

One approach to overcome the limitations of a conventional front-contacted solar cell is to move both the p-n junction and the back surface field (BSF) to the rear side of the solar cell. This architecture is referred to as the interdigitated back contact (IBC) solar cell. The concept of the IBC solar cell was first proposed by Lammert and Schwartz [M. D. Lammert and R. J. Schwartz, "The interdigitated back contact solar cell: a silicon solar cell for use in concentration," IEEE Translations on Electron Devices, vol. 24, no. 4, pp. 337-342, 1977].

By moving both the p-n junction and BSF to the rear, all metallization required to extract generated carriers is also moved to the rear side. The front, sunward side is therefore free from shading losses, enabling higher short circuit current and thus efficiency. The front surface no longer needs a heavily diffused layer optimized for metal contact, but instead can be optimized to create a front surface field (FSF) which minimizes recombination losses at the front surface thereby increasing the open circuit voltage and thus efficiency. Another advantage of having metal contacts on the rear side is that the metal geometry is no longer constrained to minimize shading losses, allowing for wider metal which reduces resistive losses. Having all metal contacts on the back side also has the added benefit of simplifying integration of solar cells into a module.

Various methods have been suggested with regard to the manufacturing process of the IBC cell. Such methods are described in P. J. Verlinden, R. M. Swanson and R. A. Crane, Prog. Photovolt: Res. Appl. 2, 143-152 (1994); F. Granek, "High-Efficiency Back-Contact Back-Junction Silicon Solar Cells," PhD Thesis, Fraunhofer Institute (ISE), Freiburg, Germany (2009); D-H. Neuhaus and A. Munzer, "Review Article: Industrial Silicon Wafer Solar Cells," Advances in OptoElectronics, Volume 2007, Article ID 24521, doi: 10.1155/2007/2451; US 2011/0003424; and US2010/0081264.

Fabricating an IBC solar cell requires creating three doped regions. Typically these three regions are (i) a phosphorus doped front surface field (FSF), (ii) a phosphorus doped back surface field (BSF), and (iii) a boron emitter. These three regions are usually created using three separate diffusion steps making the fabrication of IBC cells complex and cost prohibitive.

SUMMARY OF THE INVENTION

This invention describes a method of forming a high efficiency interdigitated back contact (IBC) solar cell employing localized boron and phosphorus diffused areas on the rear side achieved using a doping paste(s), silicon-containing paste, and an oxide barrier layer.

An aspect of the invention is a method for manufacturing an interdigitated back contact solar cell, comprising the steps of: (a) providing a silicon substrate doped with a first dopant, the substrate comprising a front, sunward facing surface, and a rear surface; (b) doping the rear surface of the silicon substrate with a second dopant in a first pattern; (c) forming a silicon dioxide layer on the rear surface; (d) depositing a silicon-containing paste comprising silicon-containing particles on the silicon dioxide layer in a second pattern; (e) exposing the substrate to a diffusion ambient at a first temperature and for a first time period in order to form a doped silicate glass layer around the substrate, wherein the diffusion ambient comprises a third dopant and wherein the third dopant is a counter dopant to the second dopant; (f) heating the substrate in a drive-in ambient to a second temperature and for a second time in order to locally diffuse the third dopant into the rear surface underneath the second pattern and in order to diffuse the third dopant into the front surface; and (g) removing the silicon dioxide layer and the doped silicate glass layer from the silicon substrate, wherein a region doped with the second dopant and a region doped with the third dopant collectively form an interdigitated pattern on the rear surface of the silicon substrate.

In an embodiment, the two phosphorus doping steps can be combined into one step by using patterned silicon-containing ink (paste) on an oxide barrier layer subjected to a diffusion process. In this case the BSF and FSF are created simultaneously during the diffusion step. The silicon ink regions create the BSF while the FSF forms on the oxide-free side of the wafer.

BRIEF DESCRIPTION OF THE DRAWINGS

FIG. 2 shows two silicon wafers (201) and (203) with $SiO_2$ layer (210) in the same configuration. FIG. 3 shows the effects of a high temperature treatment on the wafers shown in FIG. 2.

FIGS. 4A-Q shows an embodiment to fabricate an IBC solar cell. FIG. 4A shows the texturizing step. FIG. 4B shows the rear side etching step. FIG. 4C shows the oxidation step. FIG. 4D shows the printing step of the boron paste. FIG. 4E shows the boron drive-in step. FIG. 4F shows the oxide layer stripping step. FIG. 4I shows the $POCl_3$ diffusion step. FIG. 4N shows a pattern of the boron emitter metal contact. FIG. 4O shows a pattern of the BSF metal contact. FIG. 4P shows a pattern of the insulator layer. FIG. 4Q shows a pattern of the metal busbars.

FIG. 6A shows a schematic of the interdigitated pattern. FIG. 6B shows boron and phosphorus SIMS profiles under the boron paste area corresponding to the emitter region. FIG. 6C shows boron and phosphorus SIMS profiles in the non-ink gap area. FIG. 6D shows boron and phosphorus SIMS profiles under the silicon-containing paste area corresponding to the BSF region. FIG. 6E shows boron and phosphorus SIMS profiles on the non-oxidized wafer area corresponding to the FSF region.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
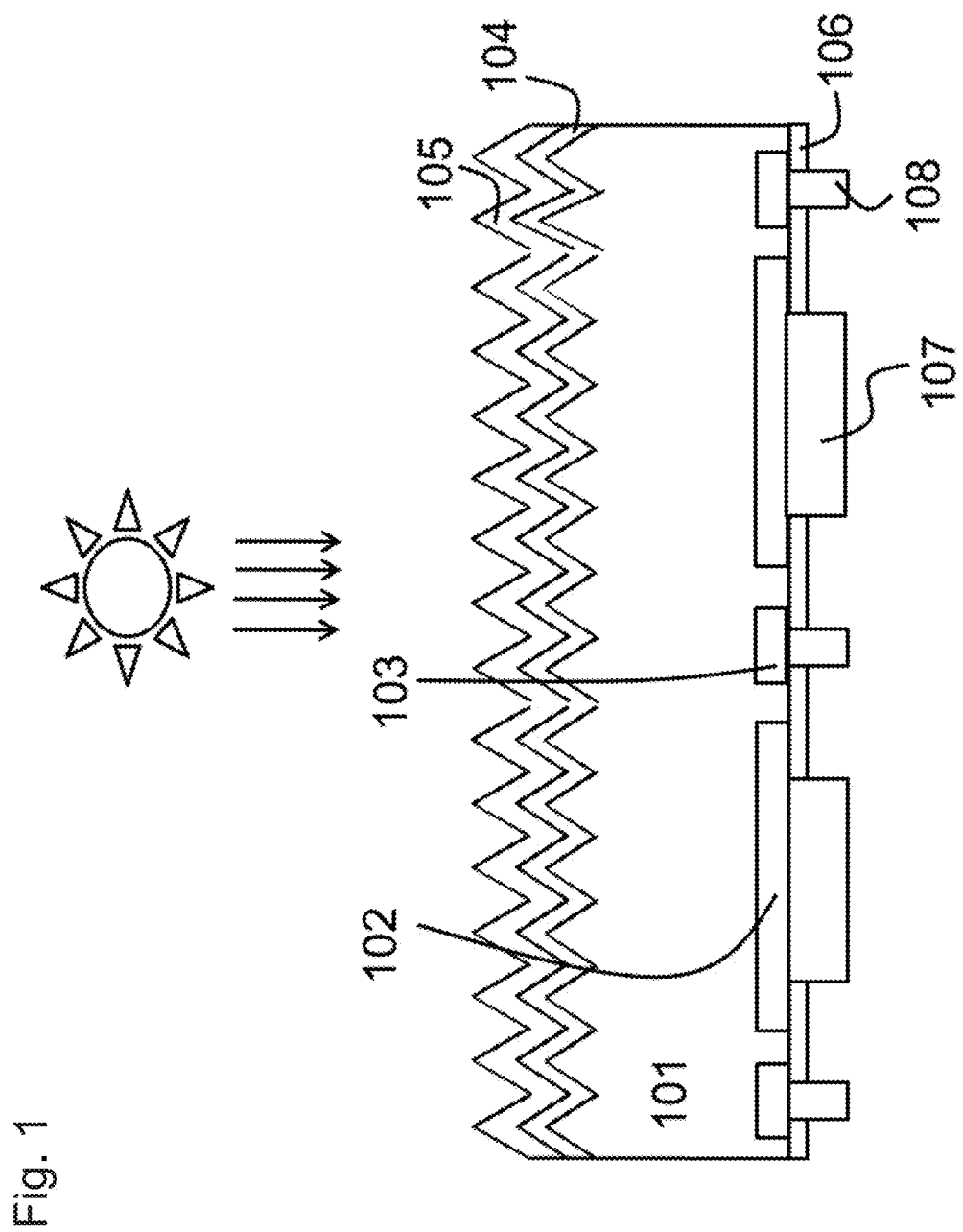
FIG. 1 shows a schematic view of an interdigitated back-contact (IBC) solar cell.

A schematic view of an interdigitated back-contact (IBC) solar cell is shown in FIG. 1. The IBC solar cell of FIG. 1 is an embodiment and the scope of the present invention is not limited to the specific type of the IBC solar cell. For example, a boron doped silicon substrate can be used instead of a phosphorus doped silicon substrate. In the embodiment of FIG. 1, a phosphorus doped silicon substrate (101) is used as the absorber. A boron emitter (102) is formed on the rear side of the cell to create the p-n junction required to separate carriers. A phosphorus BSF (103) is also formed on the rear side of the solar cell. The boron and phosphorus doped regions are formed in an interdigitated pattern. A FSF (104) is formed on the front, sunward side of the solar cell, typically employing a phosphorus diffusion. The FSF repels minority carriers from the front surface thus minimizing recombination losses. The FSF also forms a current path for majority carriers to reach the BSF region and BSF contact. The front and rear surfaces are coated with passivating films, shown as (105) and (106), respectively. Such passivating films may comprise at least one of silicon nitride, aluminum oxide and silicon oxide. In some embodiments, the passivating film may be a stack structure comprising multiple, i.e. two or more layers. Such stack structure may include at least one layer comprising silicon nitride and at least one layer comprising one of silicon oxide and aluminum oxide. Boron emitter metal contacts (107) and BSF metal contacts (108) are formed on the rear side in order to extract generated carriers.

One approach that reduces the number of thermal steps is to screen print boron and/or phosphorus doping pastes in the required interdigitated pattern followed by a thermal drive-in process to transfer dopant atoms from the pastes into the underlying silicon substrate.

Achieving patterned and localized boron and phosphorus doping on a silicon wafer using boron-containing and phosphorus-containing doping pastes is made difficult by the tendency of these pastes to outgas during the thermal treatment required to diffuse dopants into the wafer. In order to diffuse boron or phosphorus from the doping pastes into the underlying silicon substrate, a thermal treatment at temperatures above 800° C. is typically used. At these elevated temperatures gaseous boron-containing and phosphorus-containing species are created from boron-containing and phosphorus-containing pastes, respectively. These gaseous species transfer onto nearby silicon surfaces, causing a spreading of dopant outside of the intended printed areas. Gas-phase distribution of an initially patterned dopant region is called autodoping and degrades the pattern of the doped regions.

Maintaining localized doping and eliminating autodoping can be achieved by introducing a protective $SiO_2$ layer on the silicon wafer surface prior to applying a patterned doping source layer.

Figure 2:
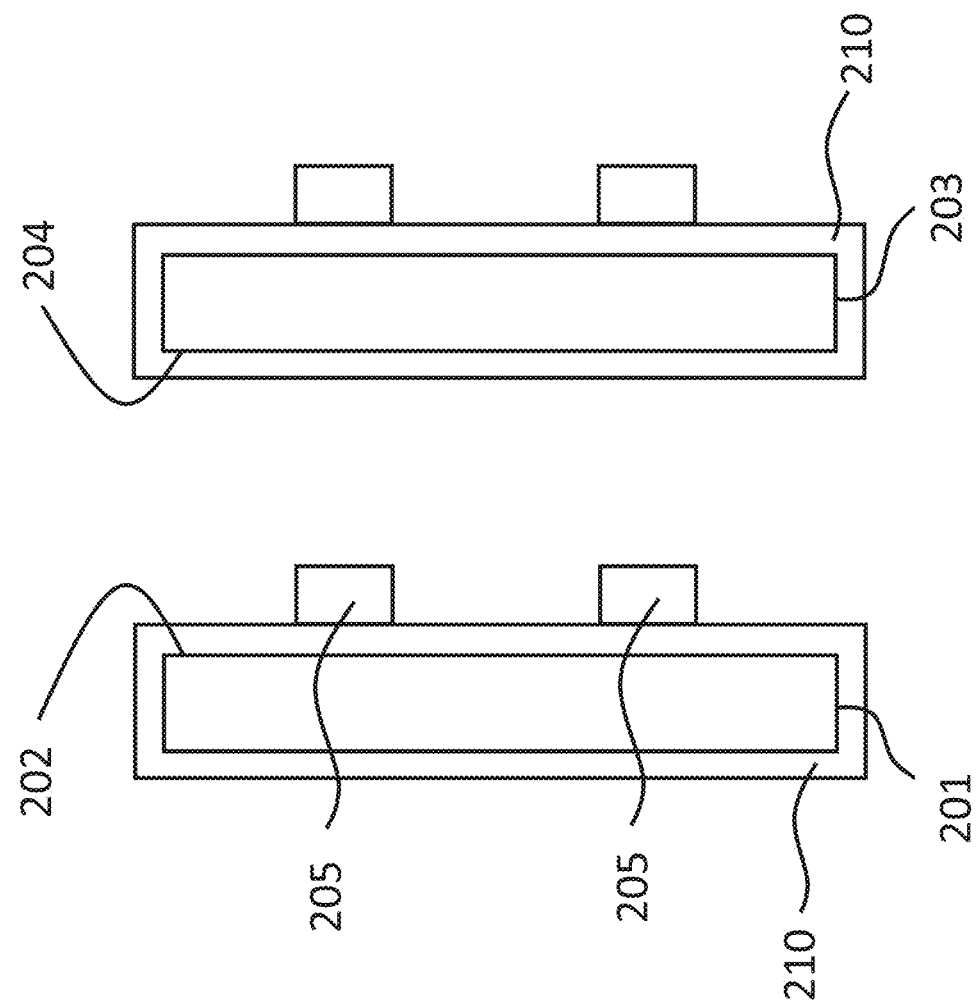
FIGS. 2 and 3 schematically show a method for achieving localized doping free from autodoping using a patterned doping source and a barrier $SiO_2$ layer.

FIG. 2 shows two silicon wafers (201) and (203) with each wafer having all surfaces covered with a $SiO_2$ layer (210). The rear surface (202) of wafer (201) is adjacent to the front side (204) of wafer (203). Also shown in FIG. 2 are patterned doping source regions (205) which are separated from the front surface (202) by the $SiO_2$ layer (210).

Figure 3:
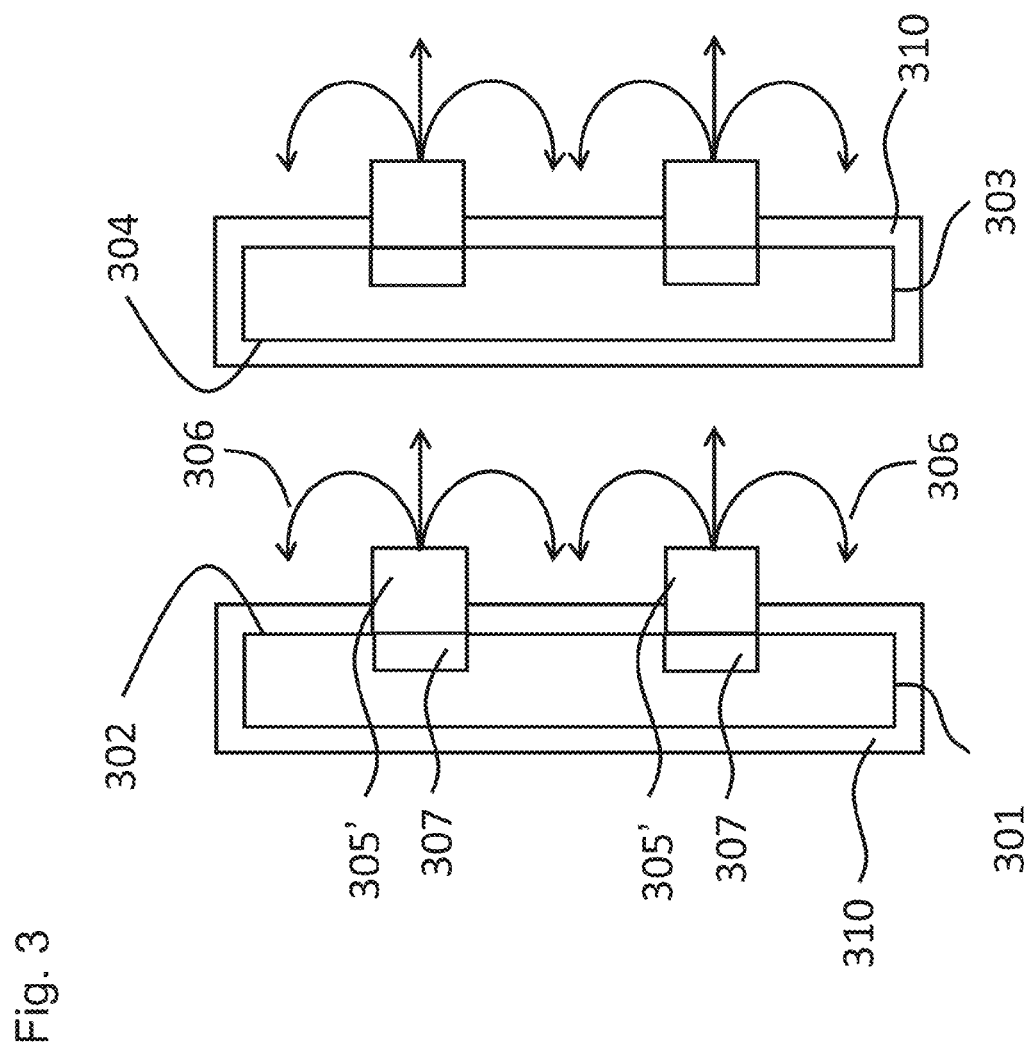

FIG. 3 shows the effects of a high temperature treatment on the wafers shown in FIG. 2. Wafers (301) and (303) are subjected to a high temperature drive-in step, typically 800° C. or higher. The doping source regions (labeled as (205) in FIG. 2) locally react with the underlying $SiO_2$ creating new doping source layers (305'). The doping source layers (305') make contact with the underlying silicon wafer surface. Dopant atoms are driven from the doping source layers (305') into the underlying wafer, creating localized doped areas (307).

At these elevated temperatures dopant species (306) transfer from the doping source regions (305') onto the $SiO_2$ layer (310) covering the rear surface (302) of the underlying wafer (301) as well as onto the $SiO_2$ layer (310) covering the front side (304) of the neighboring wafer (303). The $SiO_2$ layer (310) acts as a barrier for areas not covered with the dopant source layer (305'), preventing dopant species (306) from reaching the front surface (302) of the underlying wafer (301) as well as onto the rear side (304) of the neighboring wafer (303). The $SiO_2$ layer (310) enables localized doping and eliminates autodoping.

Conventionally, the boron emitter 102, the back surface field (BSF) 103 and the front surface field (FSF) 104 were created using three separate diffusion steps making the fabrication of IBC cells complex and cost prohibitive. An embodiment of the present invention makes it possible to combine two of the doping steps into one step by using patterned silicon-containing ink (paste) printed on an oxide barrier layer subjected to a diffusion process.

An embodiment for incorporating the doping-through-oxide approach to fabricate an IBC solar cell is shown in FIGS. 4A-4L.

The fabrication process may begin with a textured n-type silicon wafer (401) as shown in FIG. 4A. The rear side of the silicon wafer can be removed using a single-sided wet chemistry etch process using a hydrofluoric acid, nitric acid, and sulfuric acid mixture, leaving behind a non-textured rear surface (402) as shown in FIG. 4B.

The wafer is then subjected to an oxidation process which grows a $SiO_2$ layer (403) on the surface of the wafer as shown in FIG. 4C. A thermal oxidation process may be used which typically employs a heated quartz tube furnace with an oxidizing ambient.

Alternatively, the oxide layer (403) may be formed by other methods such as (i) thermal oxidation, (ii) printing and drying a composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer. The thickness of the $SiO_2$ layer is 10 nm to 100 nm in an embodiment.

For the next step, shown in FIG. 4D, a boron-containing paste is screen printed onto the oxidized rear surface followed by a low temperature bake in order to drive off solvents from the paste to form a patterned boron-containing paste area (404).

The next step is a high temperature drive-in process at a high temperature. The process is performed in a quartz tube furnace in an $N_2$ ambient in an embodiment. During this high temperature step the boron paste locally reacts with oxide layer forming new boron source layer (404') which reaches the underlying silicon wafer and locally dopes it to form the boron emitter (405) as shown in FIG. 4E. The temperature of the drive-in process is 850° C. to 1000° C. in an embodiment. The time period of the drive-in process is 20 minutes to 2 hours in an embodiment.

The next step is to remove the oxide layer and residual paste layers exposing the boron emitter (405) on the rear side as shown in FIG. 4F. The oxide layer can be removed by submerging the wafers in a dilute HF solution.

The boron doped region (405) can be created using various techniques including deposition of boron-containing doping paste, ion implantation, $BBr_3$ diffusion, $BCl_3$ diffusion and BSG deposition using chemical vapor deposition.

The deposition by use of boron-containing doping paste, which is also known as the boron ink doping-through-oxide approach described in the U.S. patent application Ser. No. 13/602,919 filed on Sep. 4, 2012, which is incorporated by reference in their entirety to the same extent as if they were individually incorporated by reference.

The whole region of the rear surface can be homogenously doped with boron in an embodiment. Such an unpatterned blanket doping can be achieved by printing the boron containing paste onto the whole rear surface of the silicon wafer. The boron paste is then baked at a low temperature in order to drive off solvents from the paste. The boron print will form a blanket pattern which after a thermal drive-in process will create a homogeneous boron emitter.

The homogenous boron emitter can be created using different methods including, but not limited to: ion implantation, $BBr_3$ or $BCl_3$ diffusion used in conjunction with a barrier layer on the front side of the wafer, and depositing a single-side BSG layer using a chemical vapor deposition tool followed by a high temperature drive-in step.

Figure 4G:
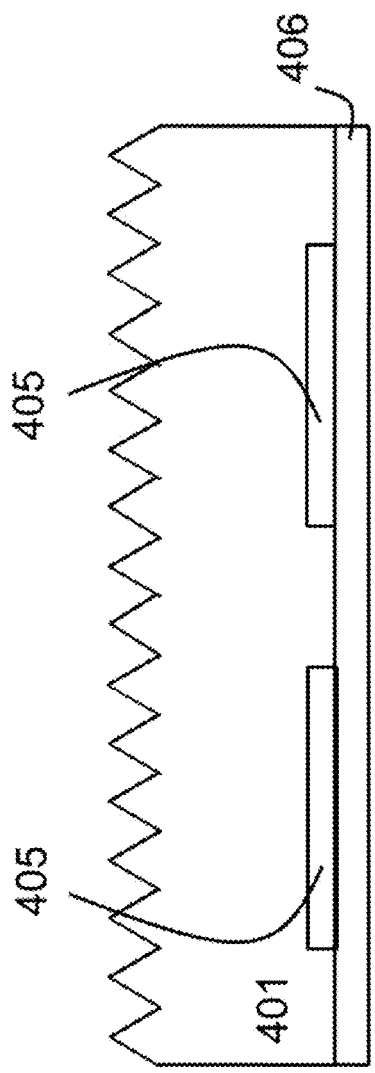
FIG. 4G shows the rear side oxidation step.

The rear side is covered with a silicon dioxide layer (406) as shown in FIG. 4G. This oxide layer can be deposited by various techniques including but not limited to: plasma enhanced chemical vapor deposition, atmospheric pressure chemical vapor deposition, printing and drying a composition comprising silicon dioxide particles, and printing and oxidizing a composition comprising of silicon particles. Alternatively, a single-side oxide can also be achieved by employing double-side oxidation processes combined with a masking step prior to oxidation or a single-side chemical etch after oxidation. Double-sided oxidation processes include but not limited to: thermal oxidation, steam oxidation, and growing and oxidizing a porous silicon layer. The thickness of the $SiO_2$ layer is 10 nm to 100 nm in an embodiment.

Figure 4H:
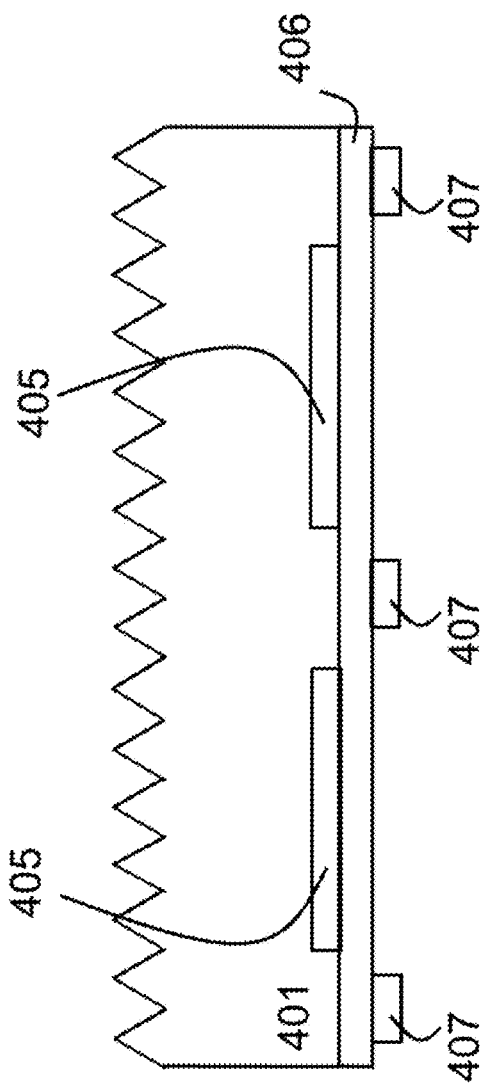
FIG. 4H shows the printing step of the silicon-containing paste.

A silicon-containing paste is then deposited onto the rear side oxide layer followed by a low temperature bake in order to drive off solvents from the paste to form a patterned silicon-containing paste region (407) as shown in FIG. 4H. The printed silicon-containing paste pattern forms an interdigitated pattern with the underlying boron doped pattern.

The silicon wafer is then subjected to a phosphorus diffusion process, like a $POCl_3$ diffusion process performed in a heated quartz tube furnace in a $POCl_3$, $N_2$, and $O_2$ ambient. During the $POCl_3$ process all surfaces are covered with a phosphorus doped glass (phosphosilicate glass: PSG) layer, shown as (408) in FIG. 4I, which acts as a phosphorus dopant source. During the diffusion process the silicon-containing ink interacts with $POCl_3$ and penetrates the oxide to the underlying wafer to form new modified silicon-containing layers (407'). The oxide-free front side of the wafer is covered with PSG and thus doped uniformly with phosphorus to form FSF (410). The temperature of the $POC_3$ diffusion is 700° C. to 900° C. in an embodiment. The time period of the $POCl_3$ diffusion process is 10 minutes to 60 minutes in an embodiment.

The next step is a high temperature drive-in process. The process is performed in a quartz tube furnace in an $N_2$ ambient, an $O_2$ ambient or a mixture thereof in an embodiment. During this high temperature step, the wafer surface underneath the silicon-containing layer (407') is heavily doped to form a phosphorus-doped BSF (409) as shown in FIG. 4I. The temperature of the drive-in process is 850° C. to 1000° C. in an embodiment. The time period of the drive-in process is 20 minutes to 2 hours in an embodiment. The rear side oxide layer (406) blocks PSG from doping the regions not printed with the silicon-containing paste (i.e. protecting the underlying boron doped regions).

In case the rear surface is homogenously doped with boron, the doping type of the area underneath the silicon-containing paste is changed during the subsequent $POCl_3$ diffusion step and the drive-in step. Phosphorus diffusing through the silicon-containing layer (407') enters the underlying wafer and changes the doping type of the area from boron-doped p+ region to phosphorous-doped n+ region through a process known as compensation.

The doping strength of the FSF can be adjusted by changing the $O_2$ concentration in the atmosphere of the drive-in process, as shown later in this specification. Preferably, the silicon-containing layers create enhanced localized phosphorus doped regions (409) with stronger doping strength than the phosphorus diffusion into the oxide-free front side of the wafer.

Figure 4J:
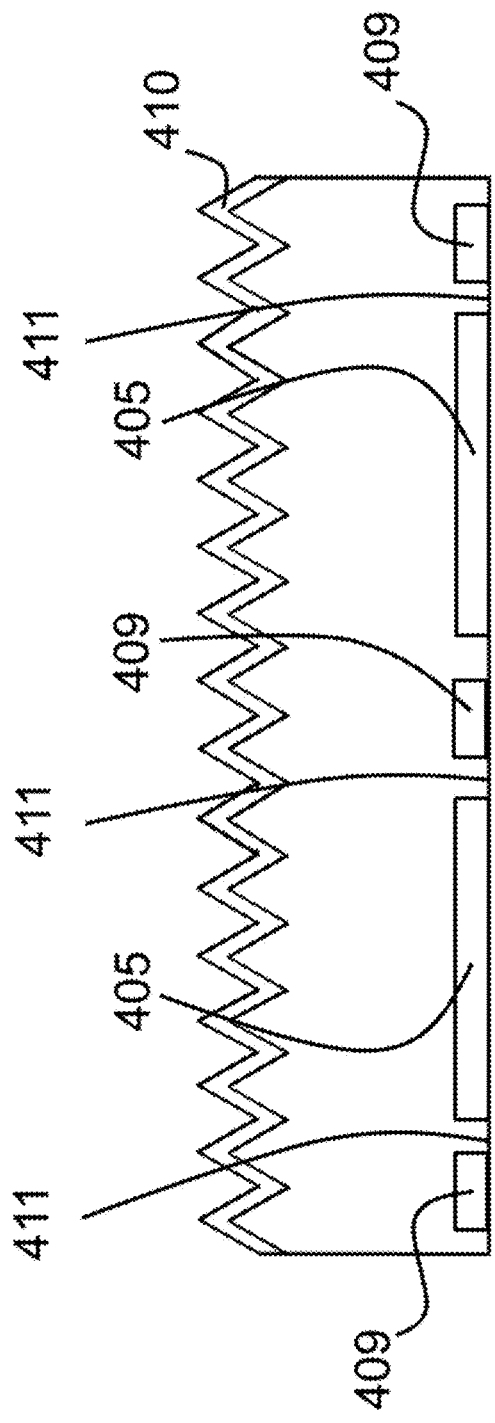
FIG. 4J shows the oxide layer stripping step.

Residual surface phosphosilicate glass (PSG) layer from the phosphorus diffusion and the rear side oxide layer can be removed by submerging the wafer in a dilute HF solution as shown in FIG. 4J. The final interdigitated doped pattern consists of three regions: the boron emitter (405), the phosphorus BSF (409) and the non-doped regions commonly referred to as the gap, indicated as (411) in FIG. 4J. In an embodiment, the gap region can be eliminated.

Figure 4K:
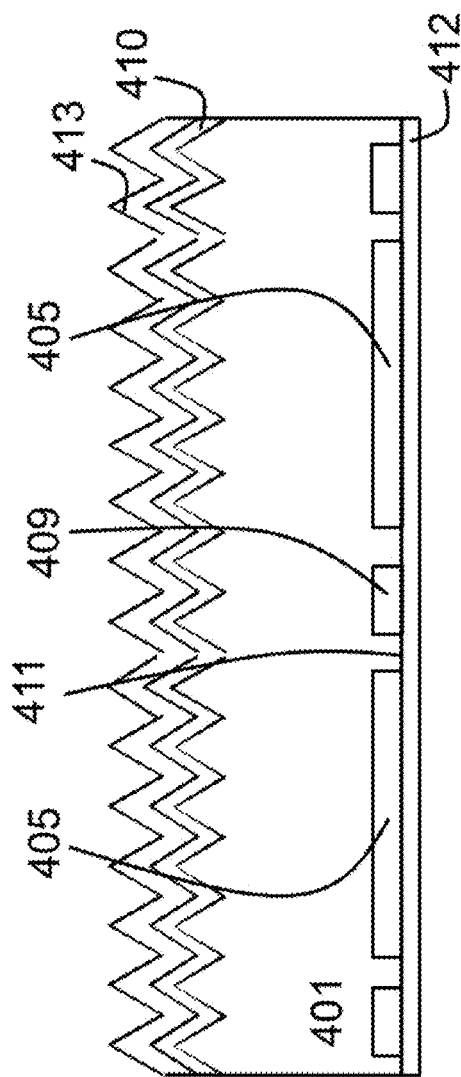
FIG. 4K shows the passivation step.

The front and rear surfaces are subsequently coated with passivation layers (413) and (412), respectively, as shown in FIG. 4K. Such passivating film may comprise at least one of silicon nitride, aluminum oxide and silicon oxide. In some embodiments, the passivating film may be a stack structure comprising multiple, i.e. two or more layers. Such stack structure may include at least one layer comprising silicon nitride and at least one layer comprising one of silicon oxide and aluminum oxide. The passivating film may be prepared using a number of techniques. In some embodiments, the passivating film may be deposited using a chemical vapor deposition technique, such as plasma enhanced chemical vapor deposition (PECVD). Passivating films deposited on the back and front surfaces of the substrate may be the same or different. In some embodiments, a passivating film on the back surface of the substrate may be thicker than the one on the front surface of the substrate, while in some other embodiments, a passivating film on the back surface of the substrate may be thinner than the one on the front surface of the substrate. A thickness of the passivating film may vary. In some embodiments, such thickness may be from 30 nm to 300 nm or from 50 nm to 250 nm or any value or subrange within these ranges.

Figure 4L:
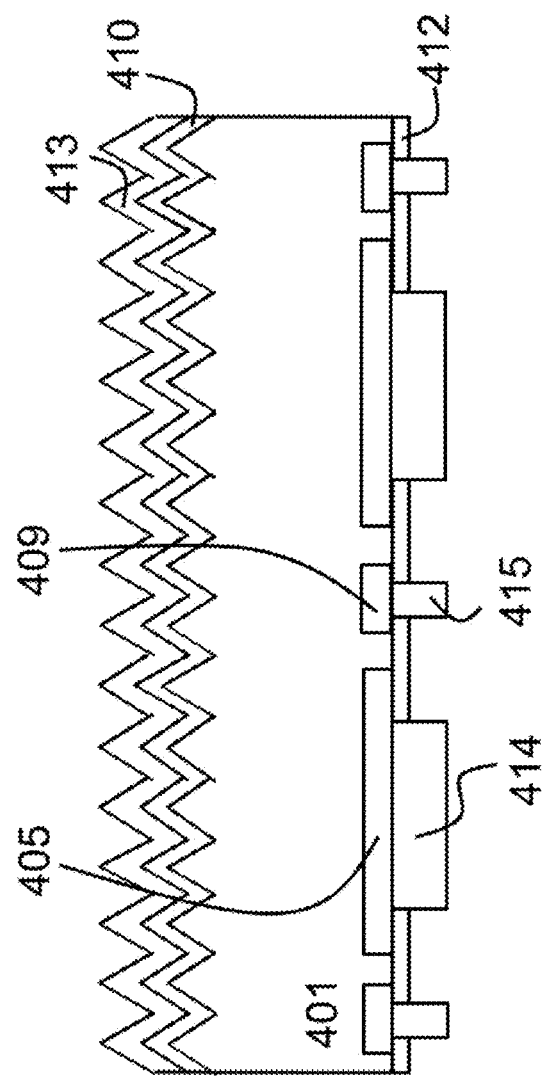
FIG. 4L shows the metallization (electrode-forming) step.

The final step is to apply boron emitter metal contacts (414) and phosphorus BSF metal contacts (415), as shown in FIG. 4L. The metal contacts can either directly contact the diffused regions, referred to as line contacts, or can locally contact the diffused regions through openings made in the passivation layers, referred to as point contacts. A process for forming the metal contacts (414, 415) is described below. However, the scope of the invention is not limited to the particular embodiment.

Two different metal compositions are used for the emitter contact and the BSF contact. In an embodiment, the same metal composition is used for both the emitter contact and the BSF contact. The two metal compositions are deposited sequentially. In an embodiment, the two metal compositions are deposited simultaneously. These metal contacts are deposited as patterns consisting of dots and/or lines. In order to describe the subsequent steps FIGS. 4M-4Q employ a two dimensional plan view of the rear side of the substrate.

Figure 4M:
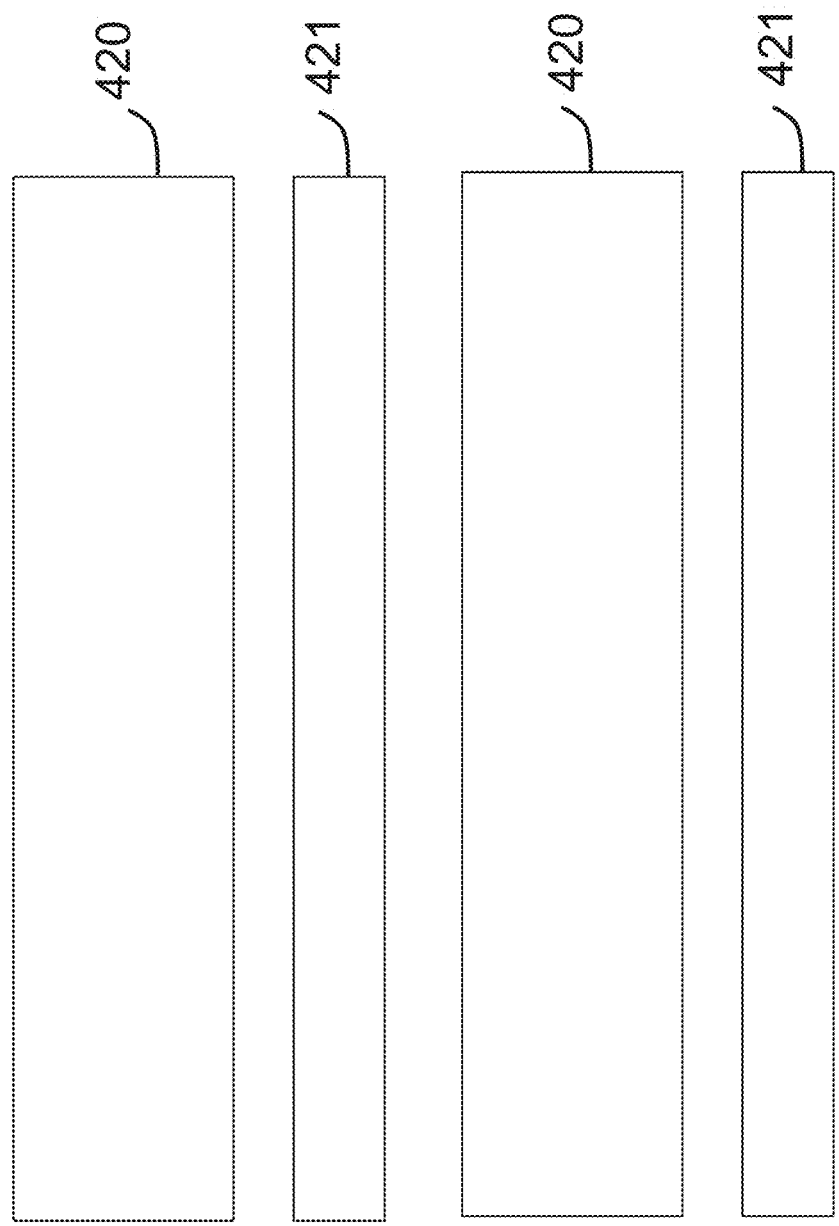
FIG. 4M shows a planview of two boron emitters and two phosphorus BSF regions.

FIG. 4M shows a series of two boron emitters indicated as (420) and a series of two phosphorus BSF regions indicated as (421). The boron emitter metal contact pattern is shown in FIG. 4N consisting of lines (422). The next step is to deposit a patterned BSF metal contact consisting of lines (423) as shown in FIG. 4O. In an embodiment, the contact for the phosphorus diffused region is a silver paste, containing organics for printability and traces of other metals or glass frits for etching SiN during the firing process. DuPont PV17x and DuPont PV16A are example products used for this application. The contact for the boron diffused regions is a silver paste, containing over 60% or more in an embodiment, 70% or more in another embodiment, and 80% or more in another embodiment of silver powder by weight.

The precise composition of the non-silver additives may be different from the phosphorus diffusion contact paste. DuPont PV3NX is an example of the product used for this application. The conductor layers are fired at temperatures above 700° C. in a belt furnace to burn off the organic components in an embodiment, densify and sinter the silver line to increase conductivity, and activate the frits which etch the SiN.

The next step is to deposit a patterned insulator layer (424) which partly overlaps segments of both the emitter contacts (422) and BSF contacts (423) as shown in FIG. 4P. The insulator regions will allow metal busbars of opposite polarity to that of the underlying doped region to traverse overtop these regions and avoid an electrical shunt path and thus allow carriers to be extracted from the solar cell. In an embodiment, the dielectric layer is composed of ceramic or oxide powders. In an embodiment, the dielectric layer is formed by screen printing a paste comprising ceramic powders or oxide powders and an organic vehicle. The organic vehicle may comprise a solvent and an organic binder for adjusting the printability. The paste melts and reflows at temperatures equal to or lower than the belt-furnace firing temperature to encapsulate the underlying conductor in an embodiment. There are many suitable compositions: compounds of boron, lead, and titanium can be mixed with silica to achieve this. In contrast to the conductors, the glass materials in the dielectric paste are unable to etch SiN in an embodiment. DuPont 5415A and DuPont QQ550 are examples of products which can be used for this application. As an alternative to this ceramic or glass insulator material, a lower temperature polymer material could be used, such as DuPont 5036. Low temperature insulators cannot be fired simultaneously with the silver conductors.

Figure 4Q:
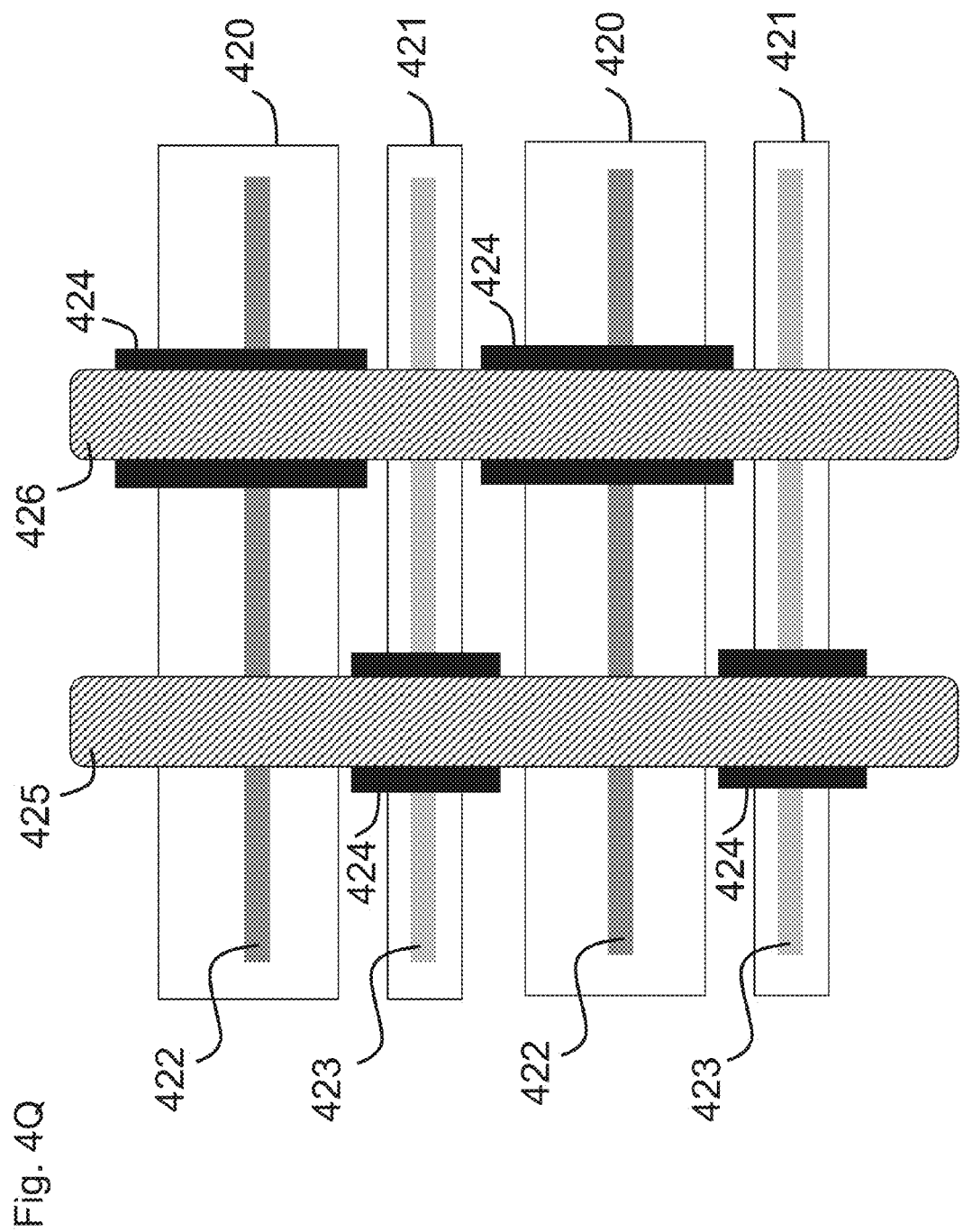

The next step is to deposit emitter and BSF metal busbars as shown in FIG. 4Q. The same metal is used and therefore all regions can be deposited simultaneously in an embodiment. The emitter metal busbar (425) electrically connects all emitter metal fingers (422). The BSF metal busbar (426) electrically connects all BSF metal fingers (423).

Various modifications can be made in the above method. For example, patent applications such as U.S. patent application Ser. No. 13/602,919 filed on Sep. 4, 2012, U.S. patent application Ser. No. 13/795,191 filed on Mar. 6, 2013, US patent publication US20100136771, US patent publication US20120145967 and US patent publication US20120280183 are incorporated by reference in their entirety to the same extent as if they were individually incorporated by reference.

In an embodiment, the phosphorus BSF (cf. 409) and the FSF (cf. 410) may be formed before the formation of the boron emitter (cf. 405). The same or similar procedure can be applied for such embodiments except that the process for forming the boron emitter and the process for forming the BSF and FSF are interchanged.

There are several methods of depositing the boron-containing paste, and the silicon-containing paste. Screen printing, in particular, is beneficial for the deposition of the paste since it is commonly used in solar cell manufacturing for the deposition of front and rear metal pastes. For the better printing efficiency and performance, the paste is preferred to be a non-Newtonian or shear-thinning fluid.

Non-Newtonian fluid refers to a fluid that has flow properties that are not described by a single constant value of viscosity, or resistance to flow. Shear thinning refers to a fluid which has a viscosity that decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste is preferred to be relatively low at high shear rates in order to pass through a screen pattern, but is also preferred to be relatively high prior to and after deposition (at low or zero shear rates), such that the paste will not run through the screen or on the substrate surface respectively.

Boron-Containing Paste

The boron-containing paste comprises a boron compound; a polymer binder, a solvent, and optionally a ceramic compound in an embodiment.

The boron compound includes, but not limited to, boron (B), boron nitride (BN), boron oxide ($B_2O_3$), boric acid ($B(OH)_3$), boron carbide ($B_4C$), boron silicide ($B_2S_1$, $B_3S_1$, $B_4S_1$, $B_6Si$), boron-doped group IV nanoparticles (such as nc-Si:B), aluminum boride ($AlB_2$), barium boride ($BaB_6$), calcium boride ($CaB_6$), cerium boride ($CeB_6$), chromium boride (CrB), cobalt boride ($Co_2B$—$Co_3B$), dysprosium boride ($DyB_4$, $DyB_6$), erbium boride ($ErB_4$), europium boride ($EuB_6$), gadolinium boride ($GdB_6$), hafnium boride ($HfB_2$), holmium boride ($HoB_4$), iron boride ($Fe_2B$), lanthanum boride ($LaB_6$), lutetium boride ($LuB_4$), magnesium boride ($MgB_2$), manganese boride (MnB, $MnB_2$), molybdenum boride (MoB), neodymium boride ($NdB_6$), nickel boride (NiB), niobium boride ($NbB_2$), praseodymium boride ($PrB_6$), rhenium boride ($Re_7B_3$), samarium boride ($SmB_6$), scandium boride ($ScB_2$), strontium boride ($SrB_6$), tantalum boride ($TaB_2$), terbium boride ($TbB_6$), thulium boride ($TmB_4$), titanium boride ($TiB_2$), tungsten boride (WB, $W_2B$, $W_2B_5$), vanadium boride ($VB_2$), ytterbium boride ($YbB_6$), and zirconium boride ($ZrB_2$, $ZrB_{12}$).

The boron compound is between 0.5 and 50 wt % in an embodiment, and between 1 and 10 wt % in another embodiment, based on the total weight of the paste.

A ceramic compound may be included in the paste in order to optimize viscoelastic behavior of the paste for screen printing. In an embodiment, the ceramic compound is selected in terms of compatibility with the silicon substrate.

The ceramic compound include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$. In an embodiment, the ceramic compound is selected from the group consisting of silicon oxide ($SiO_2$), titanium oxide ($TiO_2$), aluminum oxide ($Al_2O_3$), magnesium oxide (MgO), tantalum oxide ($Ta_2O_5$), and zirconium oxide (ZrO2), and combinations thereof.

In an alternate configuration, the particle surface of the ceramic compound may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

For the selection and modification of the ceramic compound, publicly available paper such as K. J. Hubbard and D. G. Schlom, Thermodynamic stability of binary metal oxides in contact with Silicon, J. Mater. Research, v 11(11), 1996 and prior patent application such as US Utility Patent Publication US2012/0280183 can be referred to.

The ceramic compound is between 0 and 60 wt % in an embodiment, between 3 and 40 wt % in another embodiment, 5 and 30 wt % in still another embodiment, based on the total weight of the paste.

A polymer binder may be included in the paste in order to optimize viscoelastic behavior of the paste for screen printing. The polymer binder includes, but is not limited to, polyacrylates, polymethacrylate, polyacetals, and their derivatives (e.g. methy, ethyl, butyl), polyvinyls, a cellulose (including its ethers and esters), and copolymers thereof. Two or more types of the polymer binder can be used in mixture.

The polymer binder is between 0.5 and 10 wt % in an embodiment, between 0.5 and 3 wt % in another embodiment, and between 0.75 and 2 wt % in still another embodiment, based on the total weight of the paste.

The component of the paste can be dispersed in a solvent, such as alcohols (e.g. terpineol), aldehydes, ketones (e.g. cyclohexanone), carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

Silicon-Containing Paste

The silicon-containing paste comprises silicon-containing particle, organic binder and solvent in an embodiment. The silicon-containing paste can optionally comprise one or more ceramic compound.

The silicon-containing particle is defined as particle containing silicon element. In an embodiment, the silicon-containing particle is composed of elemental silicon, silicon nitride (SiNx), silicon carbide (SiCx), silicon dioxide ($SiO_2$), silicates or mixture thereof. In another embodiment, the silicon-containing particle is composed of elemental silicon or silicon dioxide. The diameter of the silicon-containing particle is 10 nm-1000 nm in an embodiment.

In yet another embodiment, the silicon-containing particle is silicon nanoparticle.

The diameter of the silicon nanoparticle is 1-100 nm in an embodiment. In comparison to a bulk material (>100 nm) which tends to have constant physical properties regardless of its size (e.g., melting temperature, boiling temperature, density, conductivity, etc.), nanoparticles may have physical properties that are size dependent, such as a lower sintering temperature.

The silicon nanoparticles may be produced by a variety of techniques such as evaporation (S. Anima, Jap. J. Appl. Phys. 26, 357 (1987)), gas phase pyrolysis (K. A Littau, P. J. Szajowski, A. J. Muller, A. R. Kortan, L. E. Brus, J. Phys. Chem. 97, 1224 (1993)), gas phase photolysis (J. M. Jasinski and F. K. LeGoues, Chem. Mater. 3, 989 (1991)), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

The silicon nanoparticles are doped in an embodiment. The silicon nanoparticles are undoped in another embodiment.

The silicon-containing particles are included in the silicon paste at 1 to 30 wt % in an embodiment, 1 to 20 wt % in another embodiment, and 2 to 15 wt % in another embodiment, based on the total weight of the silicon paste. Two or more types of the silicon-containing particles can be used in mixture.

A ceramic compound may be included in the paste in order to optimize viscoelastic behavior of the paste for screen printing.

The ceramic compound include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$. In an embodiment, the ceramic compound is selected from the group consisting of titanium oxide ($TiO_2$), aluminum oxide ($Al_2O_3$), magnesium oxide (MgO), tantalum oxide ($Ta_2O$), and zirconium oxide (ZrO2), and combinations thereof.

In an alternate configuration, the particle surface of the ceramic compound may be treated with a ligand or capping agent in order to disperse in a set of solvents and optimize shear thinning behavior. The capping agent is selected for some property or function not possessed by the underlying surface to which it may be attached.

The ceramic compound is between 0 and 50 wt % in an embodiment, and between 10 and 40 wt % in another embodiment, based on the total weight of the paste. In one embodiment, the silicon-containing paste contains no ceramic compound.

A polymer binder may be included in the paste in order to optimize viscoelastic behavior of the paste for screen printing. The polymer binder includes, but is not limited to, polyacrylates, polyacetals, and their derivatives, polyvinyls, a cellulose (including its ethers and esters), and copolymers thereof. Two or more types of the polymer binder can be used in mixture.

The polymer binder is between 0.5 and 10 wt % in an embodiment, and between 0.75 and 6 wt % in another embodiment, based on the total weight of the paste.

The component of the paste can be dispersed in a solvent, such as terpineol, alcohols, aldehydes, ketones, carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

The solvent is between 20 and 95 wt % in an embodiment, and between 35 and 75 wt % in another embodiment, based on the total weight of the paste.

The silicon-containing paste is free of dopant in an embodiment. The term "free of dopant" is defined as a composition not containing any materials that can work as a dopant to silicon substrate at no more than the impurity level. More specifically, the concentration of such doping materials is less than 500 ppm in an embodiment, and less than 10 ppm in another embodiment.

As to the doping paste and the silicon-containing ink, prior arts such as described in US20120145967, US20110003464, and US20110003465 can be referred to.

The invention can reduce the number of doping steps required to make an IBC solar cell. The invention can employ well established and reliable screen printing technology and does not require new kinds of capital equipment not already found in a standard production line. The invention can avoid complicated patterning steps of masking layers.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

EXAMPLES

Experiment 1

A set of 156 mm pseudo square, 180 micron thick, p-type, approximately 1.3 Ohm-cm silicon wafers was oxidized in a quartz furnace at 1000° C. in an oxidizing ambient for 10 minutes creating an oxide layer of approximately 30 nm on both sides of the wafers. The oxidized wafers were screen printed with a silicon-containing paste. The paste was printed in a pattern composed of paste areas and non-paste areas. Printed wafers were subsequently baked in air at 170° C. for approximately 1 minute. A second set of 156 mm pseudo square, 180 micron thick, p-type, approximately 1.3 Ohm-cm silicon wafers was also prepared without an oxide layer.

Both sets of wafers were loaded into a quartz tube furnace and exposed to a dopant source in a diffusion furnace with an atmosphere of $POCl_3$, $N_2$, and $O_2$. Printed oxidized wafers and non-printed non-oxidized wafers were separated into 4 subsets with each subset containing both types of wafers. All the substrates had an initial deposition temperature of about 750° C. for 40 minutes.

The initial deposition was followed by a drive-in step with a drive-in temperature of about 925° C. for about 25 minutes whereby wafers were exposed to a diffusion ambient mixture of $O_2$ and $N_2$ whereby each subset of wafers was exposed to one of the following $O_2$ content levels: 0%, 3%, 10%, and 50%.

The wafers were then dipped in a dilute hydrofluoric acid solution for 5 minutes to remove the oxide layer. PSG glass, and any residual paste on the printed wafers and PSG on the non-printed, non-oxidized wafers. Sheet resistance was measured on the non-printed and printed wafers using a four point probe. For printed wafers, sheet resistance was measured on paste and non-paste areas.

Figure 5:
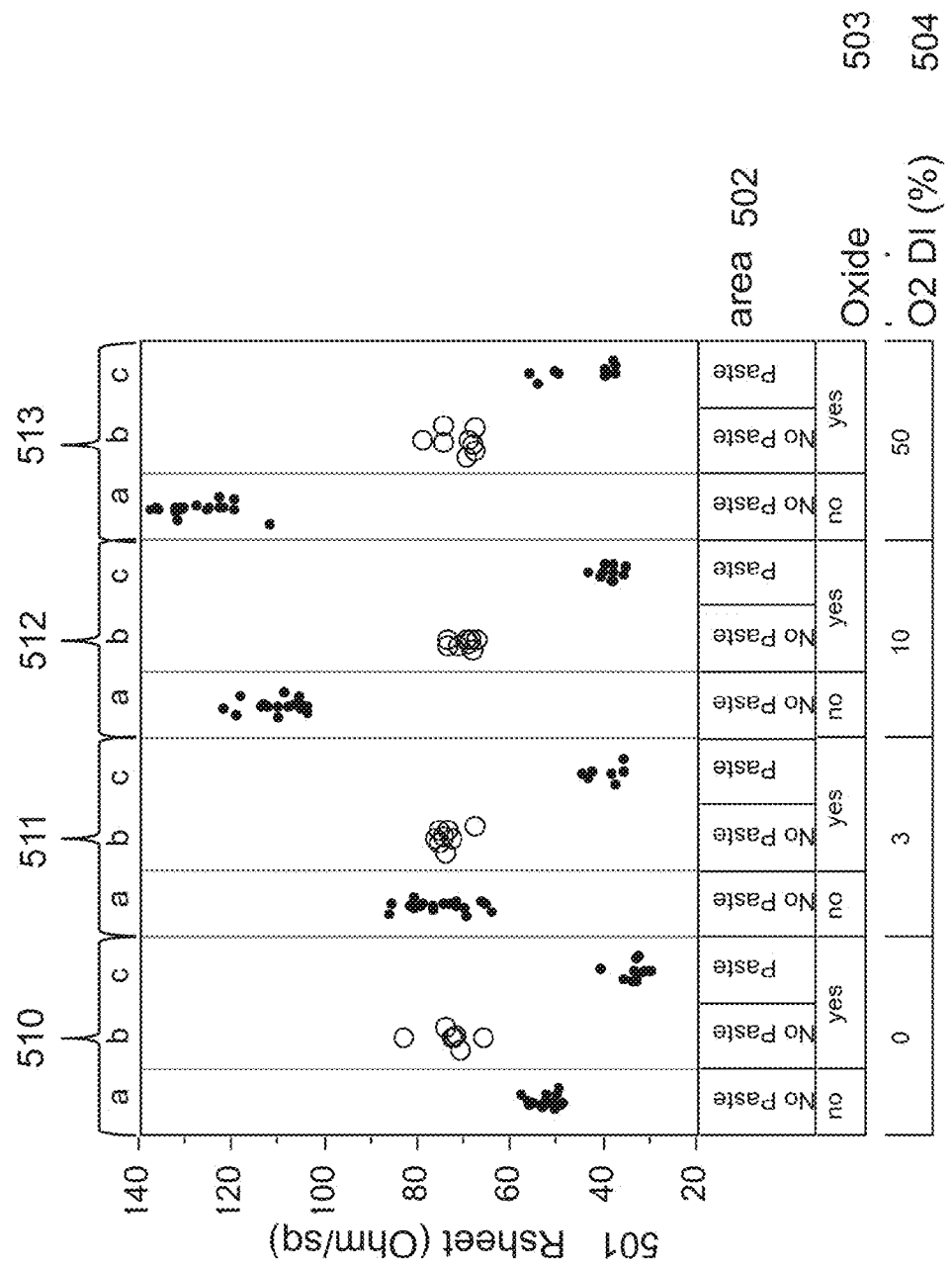
FIG. 5 shows the result of Experiment 1.

The result is shown in FIG. 5. Sheet resistance values in units of Ohm/sq are shown on axis 501. $O_2$ content during the drive-in process are shown in 504. The presence or absence of oxide barrier layer is indicated in 503. Areas on the silicon surface either covered with paste or not covered with paste are indicated in 502.

The average sheet resistance values shown in 510a, 511a, 512a, and 513a are 52.9, 75.4, 109.9, and 127.6 Ohm/sq. respectively, and correspond to the non-oxidized and non-printed wafers subjected to $POCl_3$ diffusion and drive-in process with 0%, 3%, 10%, and 50% $O_2$ content, respectively. These test regions correspond to the FSF region of an IBC cell (cf. FSF 209 in FIG. 2). The results in the data set (610a, 611a, 612a, and 613a) show increasing sheet resistance with increasing $O_2$ content, indicating the ability to tune the doping strength of the FSF.

The average sheet resistance values shown in 510b, 511b, 512b, and 513b are 73.1, 73.9, 70.2, and 71.5 Ohm/sq, respectively, and correspond to the non-printed regions on oxidized wafers subjected to $POCl_3$ diffusion and drive-in process with 0%, 3%, 10%, and 50% O2 content, respectively. These test regions correspond to areas where phosphorus doping is not desired (cf. undoped regions on rear side 411). For all $O_2$ content conditions, the measured sheet resistance in this region is the sheet resistance of the underlying wafer indicating that the oxide barrier effectively blocked phosphorus doping from the deposited PSG layer to the wafer during the $POCl_3$ diffusion and subsequent drive-in step.

The average sheet resistance values shown in 510c, 511c, 512c, and 513c are 33.7, 40.3, 38.8, and 44.3 Ohm/sq, respectively, and correspond to the silicon-containing ink printed regions on oxidized wafers subjected to $POCl_3$ diffusion and drive-in process with 0%, 3%, 10%, and 50% $O_2$ content, respectively. These test regions correspond to BSF regions of an IBC cell (cf. BSF 409 in FIG. 4). For all $O_2$ content conditions, the sheet resistance for the BSF regions is significantly lower than the sheet resistance for the corresponding FSF regions (510a, 5111a, 512a, and 513a) as required for fabricating an IBC cell. The sheet resistance offset between data set (510c, 511c, 512c, and 513c) and data set (510a, 511a, 512a, and 513a) indicates the ability to achieve simultaneous FSF and BSF formation.

Experiment 2

A set of 156 mm pseudo square, 180 micron thick, p-type, 2 Ohm-cm silicon wafers was oxidized in a quartz furnace at 1000° C. in an oxidizing ambient for 60 minutes creating an oxide layer of approximately 50 nm on both sides of the wafers. The oxidized wafers were screen printed with a boron containing paste using a first pattern. Printed wafers were subsequently baked in air at 170° C. for approximately 1 minute.

Wafers were then loaded into a quartz tube furnace and subjected to a temperature of about 905° C. for 60 minutes in an $N_2$ ambient. The wafers were then dipped in a dilute hydrofluoric acid and hydrochloric acid solution to remove the oxide layer. Wafers were cleaned in a hot mixture of $H_2O_2$, HCl and water, followed by HF:HCl to remove any residual boron paste and to clean the wafer surface for the next oxidation step.

Wafers were then oxidized in a quartz furnace at 1000° C. in an oxidizing ambient for 10 minutes creating an oxide layer of approximately 30 nm on both sides of the wafers. The oxidized wafers were screen printed with a silicon-containing paste using a second pattern wherein the first pattern and the second pattern collectively form an interdigitated pattern. Printed wafers were subsequently baked in air at 170° C. for approximately 1 minute.

A second set of 156 mm pseudo square, 180 micron thick, p-type, 2 Ohm-cm silicon wafers was also prepared without an oxide layer and without printed paste.

Both sets of wafers were loaded into a quartz tube furnace and exposed to a dopant source in a diffusion furnace with an atmosphere of $POCl_3$, $N_2$, and $O_2$. The wafers had an initial deposition temperature of about 750° C. for 40 minutes.

The initial deposition was followed by a drive-in step with drive-in temperature of about 925° C. for about 25 minutes and an ambient mixture of $O_2$ and $N_2$ whereby the $O_2$ content was 10%.

The wafers were then dipped in a dilute hydrofluoric acid solution to remove the oxide layer, PSG glass, and any residual paste on the printed wafers and PSG on the non-printed, non-oxidized wafers. SIMS profiles were measured under the boron paste printed area, under the silicon paste printed area, in the non-printed area, and on the non-printed, non-oxidized wafer.

Figure 6A:
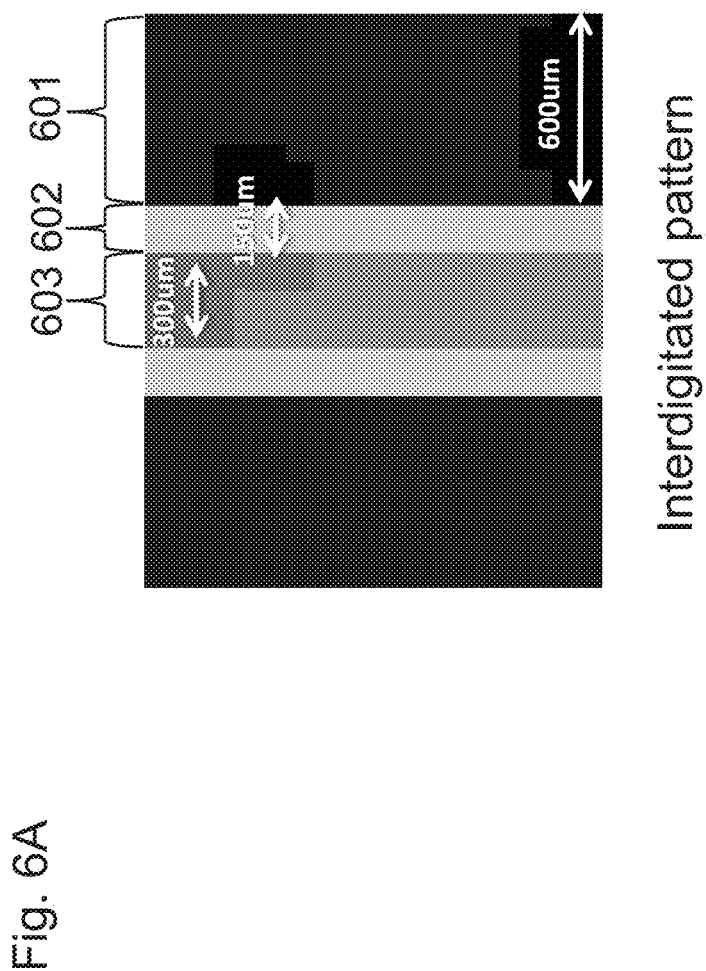
FIGS. 6A-E shows the results of Experiment 2.

FIG. 6A shows a schematic of the interdigitated pattern where the boron emitter region is indicated as 601, the non-printed region is indicated as 602 and phosphorus BSF region is indicated as 603. Boron and phosphorus SIMS profiles were measured in the center of regions 601, 602, and 603. Boron and phosphorus SIMS profiles were also measured in the center of the non-oxidized, non-printed wafer, corresponding to the FSF region.

Figure 6B:
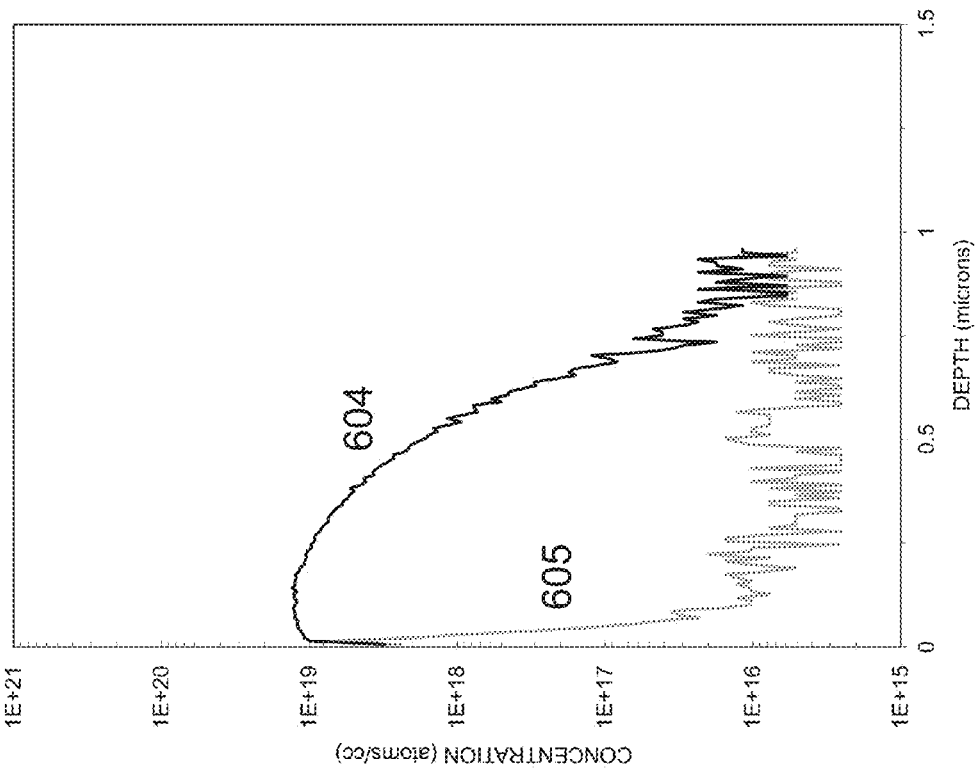
Figure 6C:
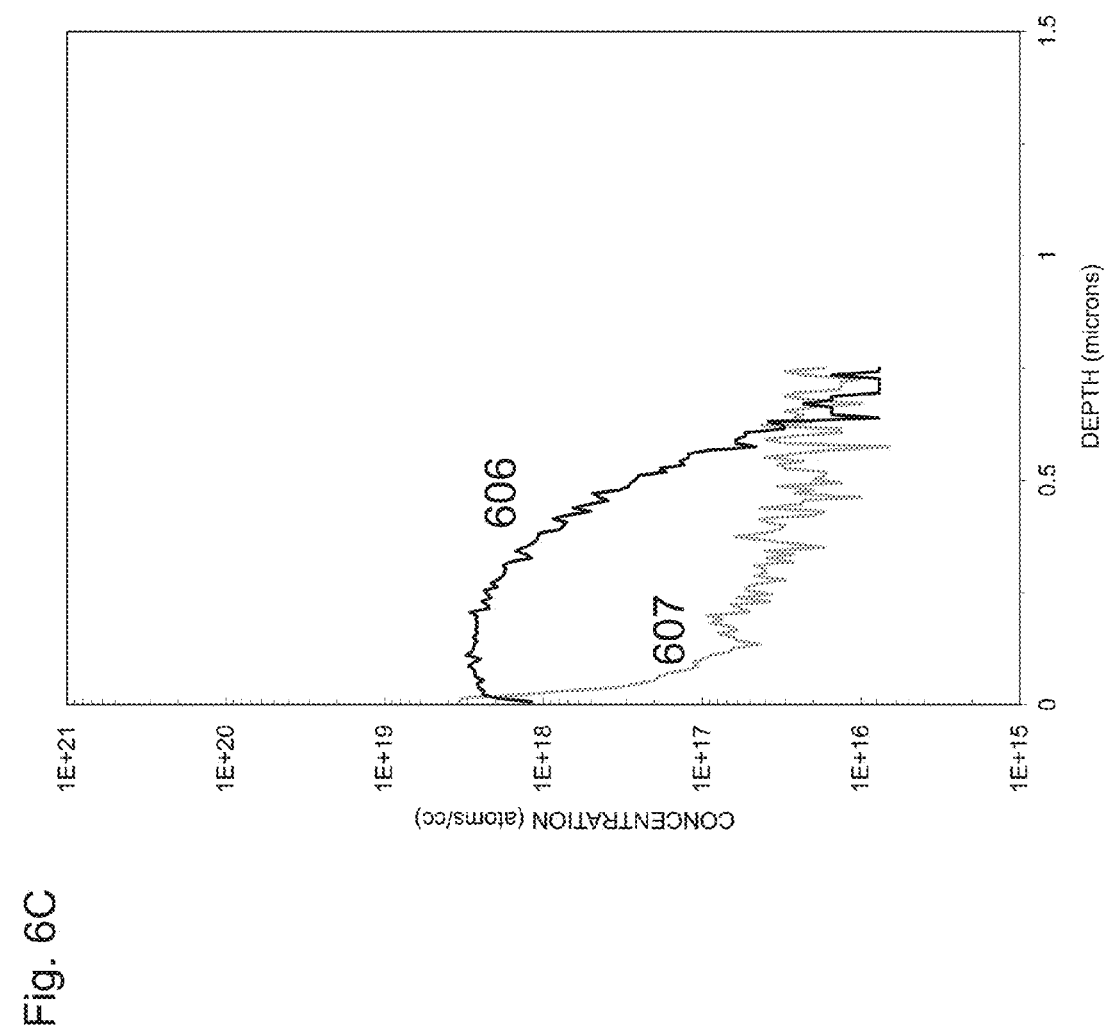
Figure 6D:
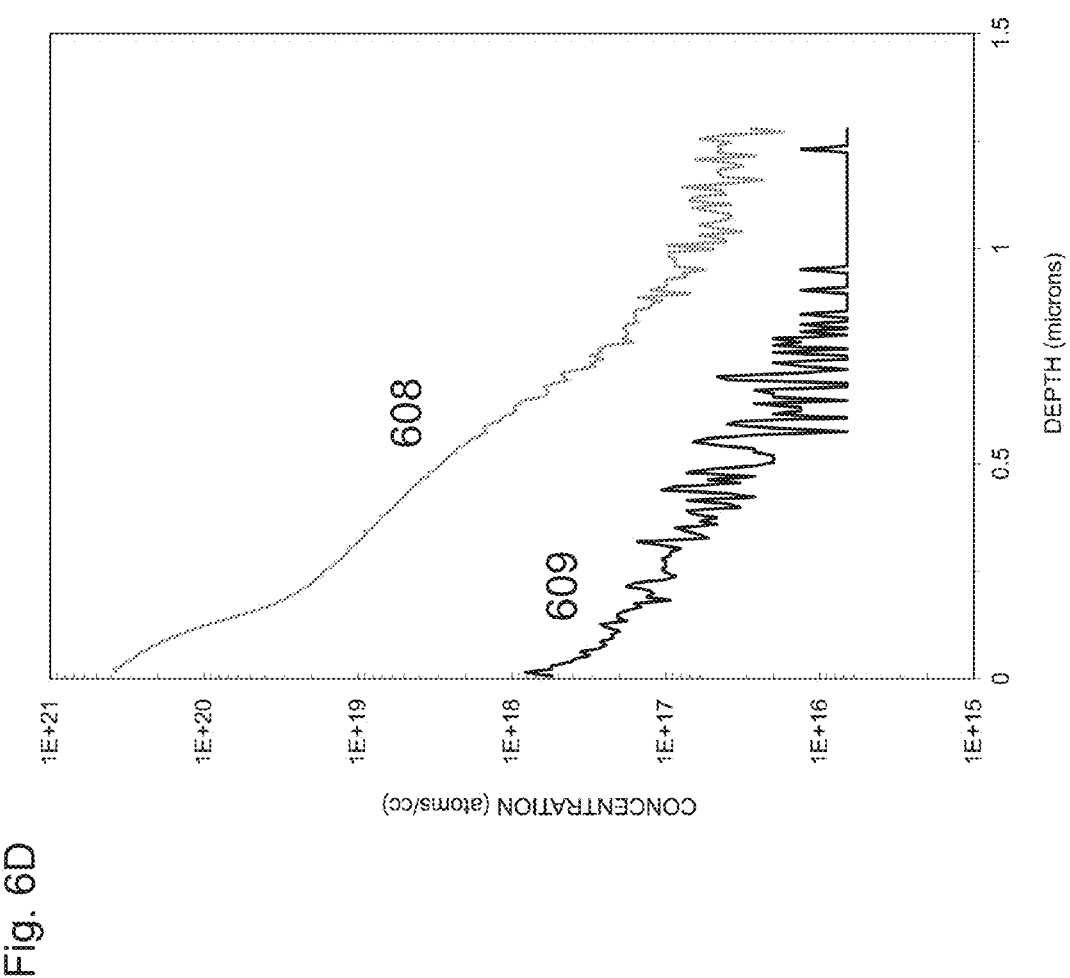
Figure 6E:
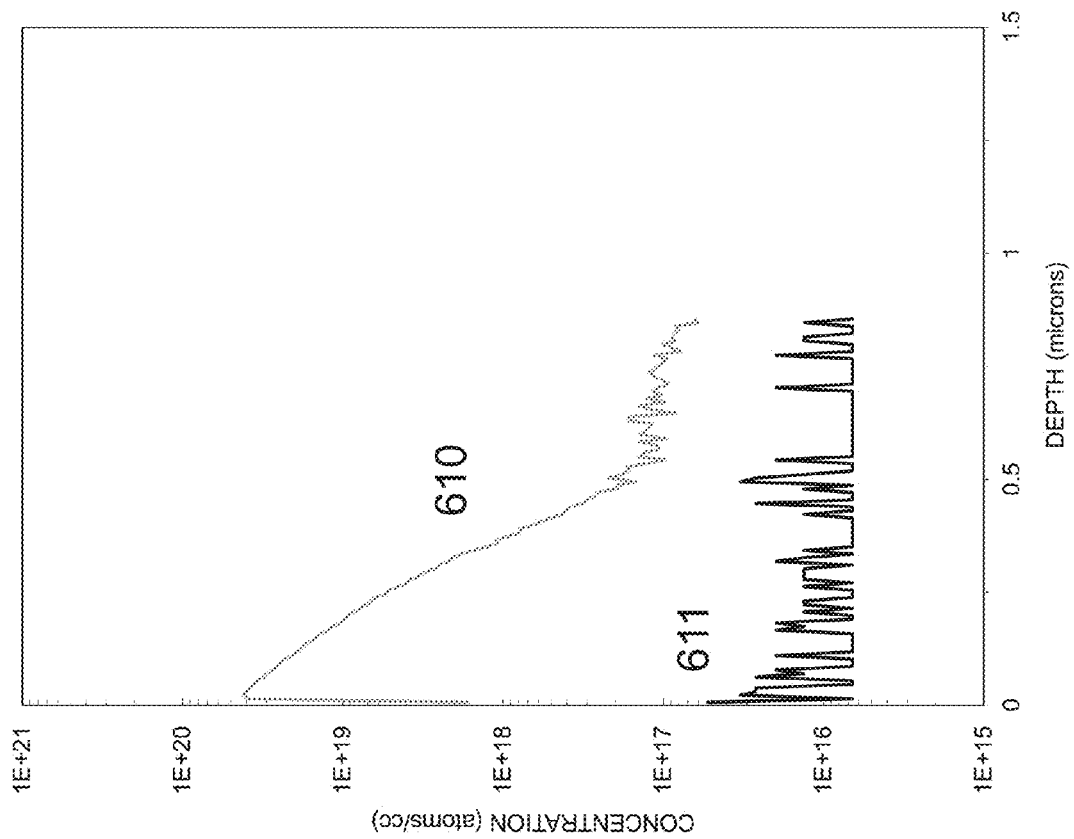

The SIMS profiles measured in the center of the boron paste printed area (601) corresponding to the emitter region is shown in FIG. 6B with the boron profile indicated as 604 and the phosphorus profile indicated as 605. The SIMS profiles measured in the center of the non-printed region (602) corresponding to the gap are shown in FIG. 6C with the boron profile indicated as 606 and the phosphorus profile indicated as 607. The SIMS profiles measured in the center of the silicon-containing paste printed area (603) corresponding to the BSF region is shown in FIG. 6D with the phosphorus profile indicated as 608 and the boron profile indicated as 609. The SIMS profile on the non-printed, non-oxidized wafer corresponding to the FSF region is shown in FIG. 7E with the phosphorus profile indicated as 610 and the boron profile indicated as 611. Comparing the phosphorus profiles in FIGS. 6D and 6E shows that the doping underneath the silicon-containing paste region (BSF) is significantly stronger than on the non-oxidized non-printed region (FSF) as required for the fabrication of an IBC solar cell.

What is claimed is:

1. A method for manufacturing an interdigitated back contact solar cell, comprising the steps of:
    (a) providing a silicon substrate doped with a first dopant, the substrate comprising a front, sunward facing surface, and a rear surface;
    (b) doping the rear surface of the silicon substrate with a second dopant in a first pattern;
    (c) forming a silicon dioxide layer on the rear surface;
    (d) depositing a silicon-containing paste comprising silicon-containing particles on the silicon dioxide layer in a second pattern;
    (e) exposing the substrate to a diffusion ambient at a first temperature and for a first time period in order to form a doped silicate glass layer around the substrate, wherein the diffusion ambient comprises a third dopant and wherein the third dopant is a counter dopant to the second dopant;
    (f) heating the substrate in a drive-in ambient to a second temperature and for a second time in order to locally diffuse the third dopant into the rear surface underneath the second pattern and in order to diffuse the third dopant into the front surface; and
    (g) removing the silicon dioxide layer and the doped silicate glass layer from the silicon substrate,
    wherein a region doped with the second dopant and a region doped with the third dopant collectively form an interdigitated pattern on the rear surface of the silicon substrate.

2. A method of claim 1, wherein the first dopant is phosphorus, wherein the second dopant is boron, wherein the third dopant is phosphorus, wherein the diffusion ambient comprises $POCl_3$ and wherein the silicate glass layer is phosphosilicate glass (PSG) layer.

3. A method of claim 1, wherein the step (b) is conducted prior to the steps (c) to (g).

4. A method of claim 3, wherein the first pattern covers the entire rear surface and the rear surface is homogeneously doped with the second dopant at the step (b).

5. A method of claim 3, wherein the rear surface is locally doped with the second dopant at the step (b).

6. A method of claim 1, wherein the steps (c) to (g) is conducted prior to the step (b).

7. A method of claim 6, wherein the first pattern covers the entire rear surface and the rear surface is homogeneously doped with the second dopant at the step (b).

8. A method of claim 6, wherein the rear surface is locally doped with the second dopant at the step (b).

9. A method of claim 1, wherein the rear surface is doped with the second dopant by the following steps:
    (b-1) forming a silicon dioxide layer covering all sides of the wafer
    (b-2) depositing a boron-containing paste on the silicon dioxide layer on the rear surface in the first pattern, wherein the boron paste comprises boron as the second dopant;
    (b-3) heating the silicon substrate in order to diffuse the second dopant into the rear surface of the silicon substrate; and
    (b-4) removing the silicon dioxide layer and residual dopant paste.

10. A method of claim 9, wherein diffusion temperature of the step (b-3) is 850-1000° C., wherein diffusion time of the step (b-3) is 20 minutes to 120 minutes.

11. A method of claim 1, wherein the first temperature is 700-900° C., wherein the first time is 10-60 minutes, wherein the second temperature is 850-1000° C., wherein the second time is 20-120 minutes.

12. A method of claim 1, wherein thickness of the silicon dioxide layer is between 10 nm and 100 nm.

13. A method of claim 1, further comprising the steps of:
    (j) forming a passivation layer on both the front surface and the rear surface; and
    (k) forming a first electrode and a second electrode on the rear surface, wherein the first electrode is in electric contact with the region doped with the second dopant on the rear surface of the silicon substrate and wherein the second electrode is in electric contact with the region doped with the third dopant on the rear surface of the silicon substrate.

14. A method of claim 1, wherein the silicon-containing particle is selected from the group consisting of elemental silicon, silicon nitride, silicon carbide, silicon dioxide, silicates, and a mixture thereof.

15. A method of claim 14, wherein the silicon-containing particle is a silicon nanoparticle.

* * * * *